United States Patent
Seo et al.

(10) Patent No.: US 9,397,308 B2
(45) Date of Patent: Jul. 19, 2016

(54) LIGHT EMITTING ELEMENT, LIGHT EMITTING DEVICE, AND ELECTRONIC DEVICE

(75) Inventors: Satoshi Seo, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1111 days.

(21) Appl. No.: 11/946,484

(22) Filed: Nov. 28, 2007

(65) Prior Publication Data
US 2008/0261075 A1 Oct. 23, 2008

(30) Foreign Application Priority Data
Dec. 4, 2006 (JP) ................................. 2006-327666

(51) Int. Cl.
| C09K 11/00 | (2006.01) |
| H01L 51/50 | (2006.01) |
| H01L 51/00 | (2006.01) |

(52) U.S. Cl.
CPC ........ *H01L 51/5004* (2013.01); *H01L 51/0038* (2013.01); *H01L 51/506* (2013.01); *H01L 51/5012* (2013.01); *H01L 51/5036* (2013.01); *H01L 51/5076* (2013.01); *H01L 51/0035* (2013.01); *H01L 51/0039* (2013.01); *H01L 51/0042* (2013.01); *H01L 51/0043* (2013.01); *H01L 51/5008* (2013.01)

(58) Field of Classification Search
None
See application file for complete search history.

(56) References Cited

U.S. PATENT DOCUMENTS

| 5,972,247 A | 10/1999 | Shi et al. |
| 6,224,966 B1 | 5/2001 | Sakai et al. |
| 6,459,199 B1 | 10/2002 | Kido et al. |
| 6,528,188 B1 | 3/2003 | Suzuki et al. |
| 6,570,180 B2 | 5/2003 | Okada et al. |
| 6,603,150 B2 | 8/2003 | Liao et al. |
| 6,680,570 B2 | 1/2004 | Roitman et al. |
| 6,699,597 B2 | 3/2004 | Bellmann et al. |

(Continued)

FOREIGN PATENT DOCUMENTS

| EP | 0 903 965 A1 | 3/1999 |
| EP | 0 952 200 A2 | 10/1999 |

(Continued)

OTHER PUBLICATIONS

David et al., Chemical Physics Letters, (2004), vol. 383, pp. 292-296.*

(Continued)

*Primary Examiner* — J. L. Yang
(74) *Attorney, Agent, or Firm* — Husch Blackwell LLP

(57) ABSTRACT

The present invention provides a light emitting element which includes an electron transporting layer and a hole transporting layer between an anode and a cathode, and a first layer and a second layer between the electron transporting layer and the hole transporting layer, wherein the first layer includes a first organic compound and an organic compound having a hole transporting property, the second layer includes a second organic compound and an organic compound having an electron transporting property, the first layer is formed in contact with the anode side of the second layer, the first organic compound and the second organic compound are the same compound, and at least one of either the organic compound having a hole transporting property and the organic compound having an electron transporting property is a high molecular compound.

25 Claims, 13 Drawing Sheets

(56) References Cited

U.S. PATENT DOCUMENTS

| | | | |
|---|---|---|---|
| 6,720,090 B2 | 4/2004 | Young et al. |
| 6,723,445 B2 | 4/2004 | Li et al. |
| 6,867,538 B2 | 3/2005 | Adachi et al. |
| 6,905,787 B2 | 6/2005 | Ise |
| 6,908,697 B2 | 6/2005 | Song et al. |
| 6,991,859 B2 | 1/2006 | Klubek et al. |
| 6,998,487 B2 | 2/2006 | Kim et al. |
| 7,097,917 B1 | 8/2006 | Fujita et al. |
| 7,163,831 B2 | 1/2007 | Hasegawa et al. |
| 7,169,482 B2 | 1/2007 | Aziz et al. |
| 7,173,370 B2 | 2/2007 | Seo et al. |
| 7,186,469 B2 | 3/2007 | Shibanuma et al. |
| 7,192,659 B2 | 3/2007 | Ricks et al. |
| 7,196,360 B2 | 3/2007 | Seo et al. |
| 7,211,335 B2 | 5/2007 | Hwang et al. |
| 7,221,088 B2 | 5/2007 | Kafafi et al. |
| 7,255,938 B2 | 8/2007 | Hamada et al. |
| 7,268,484 B2 | 9/2007 | Nakamura |
| 7,289,088 B2 | 10/2007 | Matsumoto |
| 7,291,969 B2 | 11/2007 | Tsutsui |
| 7,345,300 B2 | 3/2008 | Qin et al. |
| 7,365,360 B2 | 4/2008 | Kang et al. |
| 7,387,904 B2 | 6/2008 | Saito et al. |
| 7,394,196 B2 | 7/2008 | Morii et al. |
| 7,521,113 B2 | 4/2009 | Lu et al. |
| 7,541,098 B2 | 6/2009 | Nomura et al. |
| 7,582,508 B2 | 9/2009 | Park |
| 7,592,193 B2 | 9/2009 | Yamazaki et al. |
| 7,608,680 B2 | 10/2009 | Suzuki et al. |
| 7,622,200 B2 | 11/2009 | Ohsawa et al. |
| 7,632,578 B2 | 12/2009 | Lee et al. |
| 7,645,524 B2 | 1/2010 | Spindler et al. |
| 7,649,197 B2 | 1/2010 | Iwaki et al. |
| 7,649,211 B2 | 1/2010 | Ohsawa |
| 7,651,790 B2 | 1/2010 | Lee et al. |
| 7,663,140 B2 | 2/2010 | Yamazaki et al. |
| 7,666,691 B2 | 2/2010 | Park |
| 7,732,064 B2 | 6/2010 | Kawakami et al. |
| 7,733,009 B2 | 6/2010 | Kondakov et al. |
| 7,736,754 B2 | 6/2010 | Kijima et al. |
| 7,745,016 B2 | 6/2010 | Matsuura et al. |
| 7,750,560 B2 | 7/2010 | Yamazaki et al. |
| 7,767,317 B2 | 8/2010 | Begley et al. |
| 7,777,043 B2 | 8/2010 | Yabe et al. |
| 7,781,959 B2 | 8/2010 | Koyama |
| 7,811,677 B2 | 10/2010 | Ohsawa et al. |
| 7,821,001 B2 | 10/2010 | Kang et al. |
| 7,838,128 B2 | 11/2010 | Kawakami et al. |
| 7,868,324 B2 | 1/2011 | Nishi et al. |
| 7,879,464 B2 | 2/2011 | Kawakami et al. |
| 7,935,433 B2 | 5/2011 | Itai et al. |
| 7,964,891 B2 | 6/2011 | Kumaki et al. |
| 7,986,090 B2 | 7/2011 | Pfeiffer et al. |
| 8,039,122 B2 | 10/2011 | Kawakami et al. |
| 8,058,797 B2 | 11/2011 | Frey et al. |
| 8,080,934 B2 | 12/2011 | Kido et al. |
| 8,298,687 B2 | 10/2012 | Kawakami et al. |
| 8,314,545 B2 | 11/2012 | Tsuji et al. |
| 8,482,193 B2 | 7/2013 | Kido et al. |
| 8,686,628 B2 | 4/2014 | Kawakami et al. |
| 2001/0043043 A1 | 11/2001 | Aoyama et al. |
| 2002/0025419 A1* | 2/2002 | Lee et al. ............... 428/212 |
| 2002/0086180 A1 | 7/2002 | Seo et al. |
| 2002/0093283 A1 | 7/2002 | Seo et al. |
| 2002/0109136 A1 | 8/2002 | Seo et al. |
| 2002/0113546 A1 | 8/2002 | Seo et al. |
| 2002/0121860 A1 | 9/2002 | Seo et al. |
| 2002/0139303 A1 | 10/2002 | Yamazaki et al. |
| 2002/0155632 A1 | 10/2002 | Yamazaki et al. |
| 2002/0180347 A1 | 12/2002 | Adachi et al. |
| 2003/0010288 A1 | 1/2003 | Yamazaki et al. |
| 2003/0015960 A1* | 1/2003 | Seo et al. ............... 313/504 |
| 2003/0057827 A1 | 3/2003 | Kido et al. |
| 2003/0127970 A1 | 7/2003 | Fujii |
| 2003/0170491 A1 | 9/2003 | Liao et al. |
| 2003/0189401 A1* | 10/2003 | Kido et al. ............... 313/504 |
| 2004/0012331 A1* | 1/2004 | Yamazaki et al. ........... 313/506 |
| 2004/0018380 A1 | 1/2004 | Aziz et al. |
| 2004/0132228 A1 | 7/2004 | Magno et al. |
| 2004/0154542 A1 | 8/2004 | Yamazaki et al. |
| 2004/0219390 A1 | 11/2004 | Potrawa et al. |
| 2004/0262574 A1 | 12/2004 | Suzuki et al. |
| 2005/0029933 A1 | 2/2005 | Liao et al. |
| 2005/0048295 A1* | 3/2005 | Kim et al. ............... 428/447 |
| 2005/0052119 A1 | 3/2005 | Yu et al. |
| 2005/0064237 A1* | 3/2005 | Kato et al. ............... 428/690 |
| 2005/0095454 A1 | 5/2005 | Ko et al. |
| 2005/0110005 A1 | 5/2005 | Forrest et al. |
| 2005/0127832 A1* | 6/2005 | Toguchi et al. ............... 313/512 |
| 2005/0147844 A1* | 7/2005 | Hatwar et al. ............... 428/690 |
| 2005/0153163 A1 | 7/2005 | Klubek et al. |
| 2005/0179378 A1 | 8/2005 | Oooka et al. |
| 2005/0221121 A1 | 10/2005 | Ishihara et al. |
| 2005/0255334 A1 | 11/2005 | Kang et al. |
| 2005/0260440 A1 | 11/2005 | Seo et al. |
| 2005/0271899 A1 | 12/2005 | Brown et al. |
| 2006/0006792 A1 | 1/2006 | Strip |
| 2006/0024525 A1 | 2/2006 | Jeong et al. |
| 2006/0029725 A1 | 2/2006 | Kwong et al. |
| 2006/0032528 A1 | 2/2006 | Wang |
| 2006/0036114 A1 | 2/2006 | Wang et al. |
| 2006/0040131 A1 | 2/2006 | Klubek et al. |
| 2006/0040132 A1 | 2/2006 | Liao et al. |
| 2006/0066231 A1 | 3/2006 | Nishikawa et al. |
| 2006/0088730 A1 | 4/2006 | Begley et al. |
| 2006/0091794 A1 | 5/2006 | Agostinelli et al. |
| 2006/0188745 A1 | 8/2006 | Liao et al. |
| 2006/0210828 A1 | 9/2006 | Nakayama et al. |
| 2006/0214553 A1 | 9/2006 | Nagara et al. |
| 2006/0231843 A1 | 10/2006 | Qin et al. |
| 2006/0243967 A1 | 11/2006 | Nomura et al. |
| 2006/0243970 A1 | 11/2006 | Seo et al. |
| 2007/0001587 A1 | 1/2007 | Hatwar et al. |
| 2007/0001588 A1 | 1/2007 | Boroson et al. |
| 2007/0020483 A1 | 1/2007 | Park et al. |
| 2007/0020484 A1 | 1/2007 | Kim et al. |
| 2007/0046189 A1 | 3/2007 | Hatwar et al. |
| 2007/0048545 A1 | 3/2007 | Hatwar et al. |
| 2007/0075631 A1 | 4/2007 | Tung et al. |
| 2007/0077349 A1 | 4/2007 | Newman et al. |
| 2007/0080634 A1 | 4/2007 | Wolk |
| 2007/0085106 A1 | 4/2007 | Kawakami et al. |
| 2007/0159083 A1 | 7/2007 | Matsuura et al. |
| 2007/0164671 A1 | 7/2007 | Yamazaki et al. |
| 2007/0188083 A1 | 8/2007 | Iwakuma et al. |
| 2007/0216292 A1 | 9/2007 | Seo et al. |
| 2007/0241667 A1 | 10/2007 | Ohsawa et al. |
| 2007/0241669 A1 | 10/2007 | Liu et al. |
| 2007/0247061 A1 | 10/2007 | Adamovich et al. |
| 2007/0252517 A1 | 11/2007 | Owczarczyk et al. |
| 2007/0267968 A1 | 11/2007 | Lecloux et al. |
| 2008/0006821 A1 | 1/2008 | Suzuki et al. |
| 2008/0006822 A1 | 1/2008 | Ohsawa |
| 2008/0007165 A1* | 1/2008 | Suzuki et al. ............... 313/504 |
| 2008/0035916 A1 | 2/2008 | Seo et al. |
| 2008/0142794 A1 | 6/2008 | Shitagaki et al. |
| 2008/0150420 A1 | 6/2008 | Tsutsui |
| 2008/0231177 A1 | 9/2008 | Nomura et al. |
| 2008/0297027 A1 | 12/2008 | Miller et al. |
| 2009/0009101 A1 | 1/2009 | Kang et al. |
| 2009/0140634 A1 | 6/2009 | Nomura et al. |
| 2009/0230856 A1 | 9/2009 | Tsutsui et al. |
| 2009/0309093 A1 | 12/2009 | Iwaki et al. |
| 2010/0171112 A1 | 7/2010 | Ohsawa |
| 2011/0291088 A1 | 12/2011 | Seo et al. |
| 2012/0009333 A1 | 1/2012 | Miura |
| 2013/0005067 A1 | 1/2013 | Kawakami et al. |
| 2013/0168650 A1 | 7/2013 | Abe |
| 2013/0228762 A1 | 9/2013 | Ohsawa |

FOREIGN PATENT DOCUMENTS

| | | |
|---|---|---|
| EP | 1 221 473 A1 | 7/2002 |
| EP | 1 339 112 A2 | 8/2003 |

(56) References Cited

FOREIGN PATENT DOCUMENTS

| | | |
|---|---|---|
| EP | 1 374 641 A1 | 1/2004 |
| EP | 1 385 221 A2 | 1/2004 |
| EP | 1 388 904 A2 | 2/2004 |
| EP | 1 528 074 A1 | 5/2005 |
| EP | 1718122 A1 | 11/2006 |
| EP | 2 065 950 A2 | 6/2009 |
| EP | 2 327 739 A1 | 6/2011 |
| EP | 2 479 814 A1 | 7/2012 |
| JP | 6-158038 | 6/1994 |
| JP | 11-312588 | 11/1999 |
| JP | 2000-231987 | 8/2000 |
| JP | 2000-252072 | 9/2000 |
| JP | 2001-319779 | 11/2001 |
| JP | 2001-326079 | 11/2001 |
| JP | 2002-260861 | 9/2002 |
| JP | 2004-95546 | 3/2004 |
| JP | 2004-103577 | 4/2004 |
| JP | 2004-292782 | 10/2004 |
| JP | 2004-356033 | 12/2004 |
| JP | 2005-11734 | 1/2005 |
| JP | 2005-11735 | 1/2005 |
| JP | 2005-235403 | 9/2005 |
| JP | 2005-285708 | 10/2005 |
| JP | 2005-314239 A | 11/2005 |
| JP | 2006-49057 | 2/2006 |
| JP | 2006-120821 | 5/2006 |
| JP | 2006-196797 | 7/2006 |
| KR | 2003-0080056 A | 10/2003 |
| WO | WO 97/43874 A1 | 11/1997 |
| WO | WO 02/071813 A1 | 9/2002 |
| WO | WO 03/100880 A2 | 12/2003 |
| WO | WO 2004/059604 A2 | 7/2004 |
| WO | WO 2004/066315 A2 | 8/2004 |
| WO | WO 2004/096946 A1 | 11/2004 |
| WO | WO-2005/079118 A1 | 8/2005 |
| WO | WO 2005/109542 A1 | 11/2005 |
| WO | WO 2006/104221 A1 | 10/2006 |

OTHER PUBLICATIONS

Liu et al. J. Polymer Sci. Part A: Polymer Chem. 2004, 42, p. 4792.*

Goldsmith, C. et al., "C-H Bond Activation by a Ferric Methoxide Complex: Modeling the Rate-Determining Step in the Mechanism of Lipoxygenase," Journal of the American Chemical Society, vol. 124, No. 1, 2002, pp. 83-96.

Onisihi et al., "A Method of Measuring an Energy Level," *High Molecular EL Materials—Development of Light-Emitting High Molecular Compounds*, KYORITSU SHUPPAN Dec. 25, 2004, pp. 64-67.

Written Opinion re Application No. PCT/JP2007/060940, dated Aug. 21, 2007.

International Search Report re application No. PCT/JP2007/060940, dated Aug. 21, 2007.

Onishi et al., "A Method of Measuring an Energy Level," *High Molecular EL Materials—Development of Light-Emitting High Molecular Compounds*, Kyoritsu Shuppan Dec. 25, 2004, pp. 64-67 (with English translation, pp. 1-3).

Sakamoto, G. et al., Significant Improvement of Device Durability in Organic Light-Emitting Diodes by Doping both Hole Transport and Emitter Layers with Rubrene Molecules, Applied Physics Letters, vol. 75, No. 6 Aug. 9, 1999, pp. 766-768.

Jiang, C. et al., "High-Efficiency, Saturated Red-Phosphorescent Polymer Light-Emitting Diodes Based on Conjugated and Non-Conjugated Polymers Doped with an Ir Complex," Advanced Materials, vol. 16, No. 6, Mar. 18, 2004, pp. 537-541.

Popovic, Z.D. et al., "Life Extension of Organic LED's by Doping of a Hole Transport Layer," Thin Solid Films, Elsevier Publishers, vol. 363, 2000, pp. 6-8.

Schmitz, C. et al., "A Combinatorial Study of the Dependence of Organic LED Characteristics on Layer Thickness," Advanced Materials, vol. 11, No. 10, 1999, pp. 821-826.

Park, Y. et al., "Work Function of Indium Tin Oxide Transparent Conductor Measured by Photoelectron Spectroscopy," Applied Physics Letters, vol. 68, No. 19, May 6, 1996, pp. 2699-2701.

Fang, Y.-K. et al., "New poly(4,4'-dicyano-4"-vinyl-triphenylamine) Host Material for Single-Layer Ir Complex Phosphorescent Light-Emitting Devices," Polymer Journal, vol. 42, No. 4, 2010, pp. 327-335.

Friend, R.H. et al., "Electroluminescence in Conjugated Polymers," Nature, vol. 397, No. 6715, Jan. 14, 1999, pp. 121-128.

European Search Report re Application No. EP 07023467.9; dated Oct. 21, 2013.

European Search Report for EP Application No. 07023467.9, dated Apr. 9, 2013.

Liu et al., "Poly[2,7-(9,9-dihexylfluorene)-alt-pyridine] with Donor-Acceptor Architectures: A New Series of Blue-Light-Emitting Alternating Copolymers," *Journal of Polymer Science Part A: Polymer Chemistry*, Oct. 1, 2004, vol. 42, No. 19, pp. 4792-4801.

Korean Office Action re Application No. KR 2007-0124963, dated Mar. 18, 2014.

* cited by examiner

LIGHT EMITTING ELEMENT, LIGHT EMITTING DEVICE, AND ELECTRONIC DEVICE

BACKGROUND OF THE INVENTION

1. Field of the Invention

The present invention relates to a current excitation type light emitting element. In addition, the present invention relates to a light emitting device and an electronic device having the light emitting element.

2. Description of the Related Art

In recent years, research and development have been extensively conducted on light emitting elements using electroluminescence. In a basic structure of such a light emitting element, a substance having a light emitting property is interposed between a pair of electrodes. By applying voltage to this element, light emission can be obtained from the substance having a light emitting property.

Since such a light emitting element is of self light emitting type, it is considered that the light emitting element has advantages over a liquid crystal display in that visibility of pixels is high, backlight is not required, and so on and is therefore suitable as a flat panel display element. In addition, other advantages of such a light emitting element are that the element can be manufactured to be thin and lightweight and the response speed is very high.

Since the light emitting element can be formed into a film shape, surface light emission can be easily obtained by forming a large-area element. This is a feature which is difficult to be obtained by point light sources typified by an incandescent lamp and an LED or linear light sources typified by a fluorescent lamp. Accordingly, the light emitting element is extremely effective for use as a surface light source applicable to illumination and the like.

Light emitting elements using electroluminescence are classified broadly according to whether they use an organic compound or an inorganic compound as a light emitting substance.

When an organic compound is used as a light emitting substance, electrons and holes are injected into a layer including a light emitting organic compound from a pair of electrodes by voltage application to a light emitting element, so that a current flows therethrough. The electrons and holes (i.e., carriers) are recombined, and thus, the light emitting organic compound becomes in an excited state. The light emitting organic compound returns to a ground state from the excited state, thereby emitting light. Based on this mechanism, such a light emitting element is called a current excitation type light emitting element.

It is to be noted that the excited state of an organic compound can be a singlet excited state or a triplet excited state, and luminescence from the singlet excited state is referred to as fluorescence, and luminescence from the triplet excited state is referred to as phosphorescence.

In improving element characteristics of such a light emitting element, there are many problems which depend on a material, and in order to solve the problems, improvement of an element structure, development of a material, and the like have been carried out.

For example, Reference 1 describes a light emitting element in which a guest substance is dispersed in the whole organic function layer between electrodes to enhance the possibility of injection and recombination of electrons and holes for light emission. However, Reference 1 does not refer to a lifetime of the light emitting element (Reference 1: Japanese Published Patent Application No. H 6-158038).

Such a light emitting element including a light emitting organic compound can be driven at lower voltage than a light emitting element using a light emitting inorganic compound; however, such a light emitting element including a light emitting organic compound has a problem of having a short lifetime. Thus, a light emitting element with a longer lifetime is desired.

SUMMARY OF THE INVENTION

In view of the above problems, it is an object of the present invention to provide light emitting elements having long lifetimes. Further, it is another object of the present invention to provide light emitting devices and electronic devices having long lifetimes.

According to the present invention, a substantial light emitting region of a light emitting layer is set in the vicinity of the center of the light emitting layer in a light emitting element. In other words, a light emitting layer is constituted by a combination of layers having different carrier transporting properties so that the light emitting region is set in the vicinity of the center of the light emitting layer, not at the interface between the light emitting layer and a hole transporting layer or at the interface between the light emitting layer and an electron transporting layer.

Accordingly, an aspect of the present invention is a light emitting element comprising an electron transporting layer and a hole transporting layer between a first electrode and a second electrode, and a first layer and a second layer between the electron transporting layer and the hole transporting layer. The first layer includes a first organic compound and an organic compound having a hole transporting property, the second layer includes a second organic compound and an organic compound having an electron transporting property, the first layer is formed in contact with the first electrode side of the second layer, at least one of either the organic compound having a hole transporting property and the organic compound having an electron transporting property is a high molecular compound, the first organic compound and the second organic compound are the same compound and a voltage is applied to the first electrode and the second electrode so that a potential of the first electrode is higher than that of the second electrode, thereby making the first organic compound and the second organic compound emit light.

Another aspect of the present invention is a light emitting element comprising an electron transporting layer and a hole transporting layer between a first electrode and a second electrode, and a first layer and a second layer between the electron transporting layer and the hole transporting layer. The first layer includes a first organic compound and an organic compound having a hole transporting property, the highest occupied molecular orbital level (HOMO level) of the organic compound having a hole transporting property is greater than or equal to −6.0 eV and less than or equal to −5.0 eV, and the lowest unoccupied molecular orbital level (LUMO level) of the organic compound having a hole transporting property is greater than or equal to −3.0 eV and less than or equal to −2.0 eV, the second layer includes a second organic compound and an organic compound having an electron transporting property, the highest occupied molecular orbital level (HOMO level) of the organic compound having an electron transporting property is greater than or equal to −6.0 eV and less than or equal to −5.0 eV, and the lowest unoccupied molecular orbital level (LUMO level) of the organic compound having an electron transporting property is greater than or equal to −3.0 eV and less than or equal to −2.0 eV, the first layer is formed in contact with the first electrode side of the second layer, at least one of either the organic compound having a hole transporting property and the organic compound having an electron transporting property is a high molecular compound, the first organic compound and the second organic compound are the same compound and a voltage is applied to the first electrode and the second electrode so that a potential of the first electrode is higher than that of the second electrode, thereby making the first organic compound and the second organic compound emit light.

Another aspect of the present invention is a light emitting element comprising an electron transporting layer and a hole transporting layer between a first electrode and a second electrode, and a first layer and a second layer between the electron transporting layer and the hole transporting layer. The first layer includes a first organic compound and an organic compound having a hole transporting property, the second layer includes a second organic compound and an organic compound having an electron transporting property, the first layer is formed in contact with the first electrode side of the second layer, a difference between the highest occupied molecular orbital level of the organic compound having a hole transporting property and the highest occupied molecular orbital level of the organic compound having an electron transporting property is 0.3 eV or less, a difference between the lowest unoccupied molecular orbital level of the organic compound having a hole transporting property and the lowest unoccupied molecular orbital level of the organic compound having an electron transporting property is 0.3 eV or less, at least one of either the organic compound having a hole transporting property and the organic compound having an electron transporting property is a high molecular compound, the first organic compound and the second organic compound are the same compound and a voltage is applied to the first electrode and the second electrode so that a potential of the first electrode is higher than that of the second electrode, thereby making the first organic compound and the second organic compound emit light.

Another aspect of the present invention is a light emitting element comprising a light emitting layer between a first electrode and a second electrode, and a first layer and a second layer included in the light emitting layer. The first layer includes a first organic compound and an organic compound having a hole transporting property, the second layer includes a second organic compound and an organic compound having an electron transporting property, the first layer is formed in contact with the first electrode side of the second layer, at least one of either the organic compound having a hole transporting property and the organic compound having an electron transporting property is a high molecular compound, the first organic compound and the second organic compound are the same compound and a voltage is applied to the first electrode and the second electrode so that a potential of the first electrode is higher than that of the second-electrode, thereby making the first organic compound and the second organic compound emit light.

Another aspect of the present invention is a light emitting element comprising a light emitting layer between a first electrode and a second electrode, and a first layer and a second layer included in the light emitting layer. The first layer includes a first organic compound and an organic compound having a hole transporting property, the highest occupied molecular orbital level (HOMO level) of the organic compound having a hole transporting property is greater than or equal to −6.0 eV and less than or equal to −5.0 eV, and the lowest unoccupied molecular orbital level (LUMO level) of the organic compound having a hole transporting property is greater than or equal to −3.0 eV and less than or equal to −2.0 eV, the second layer includes a second organic compound and an organic compound having an electron transporting property, the highest occupied molecular orbital level (HOMO level) of the organic compound having an electron transporting property is greater than or equal to −6.0 eV and less than or equal to −5.0 eV, and the lowest unoccupied molecular orbital level (LUMO level) of the organic compound having an electron transporting property is greater than or equal to −3.0 eV and less than or equal to −2.0 eV, the first layer is formed in contact with the first electrode side of the second layer, at least one of either the organic compound having a hole transporting property and the organic compound having an electron transporting property is a high molecular compound, the first organic compound and the second organic compound are the same compound and a voltage is applied to the first electrode and the second electrode so that a potential of the first electrode is higher than that of the second electrode, thereby making the first organic compound and the second organic compound emit light.

Another aspect of the present invention is a light emitting element comprising a light emitting layer between a first electrode and a second electrode, and a first layer and a second layer included in the light emitting layer. The first layer includes a first organic compound and an organic compound having a hole transporting property, the second layer includes a second organic compound and an organic compound having an electron transporting property, the first layer is formed in contact with the first electrode side of the second layer, a difference between the highest occupied molecular orbital level of the organic compound having a hole transporting property and the highest occupied molecular orbital level of the organic compound having an electron transporting property is 0.3 eV or less, a difference between the lowest unoccupied molecular orbital level of the organic compound having a hole transporting property and the lowest unoccupied molecular orbital level of the organic compound having an electron transporting property is 0.3 eV or less, at least one of either the organic compound having a hole transporting property and the organic compound having an electron transporting property is a high molecular compound, the first organic compound and the second organic compound are the same compound and a voltage is applied to the first electrode and the second electrode so that a potential of the first electrode is higher than that of the second electrode, thereby making the first organic compound and the second organic compound emit light.

The present invention also includes a light emitting device having the above-described light emitting element in its category. The light emitting device in this specification includes image display devices, light emitting devices, and light sources (including illumination devices). Further, the light emitting device includes all of the following modules: modules in which a connector such as an FPC (flexible printed circuit), a TAB (tape automated bonding) tape, or a TCP (tape carrier package) is attached to a panel in which a light emitting element is formed; modules having a TAB tape or a TCP provided with a printed wiring board at the end thereof; and modules having an IC (integrated circuit) directly mounted on a light emitting element by a COG (chip on glass) method.

An electronic device using the light emitting element of the present invention in its display portion is also included in the category of the present invention. Therefore, one feature of the electronic device of the present invention is to include a display portion where the aforementioned light emitting element and a controller for controlling light emission of the light emitting element are equipped.

In a light emitting element of the present invention, a light emitting region is formed in the vicinity of the center of a light emitting layer, not at the interface between the light emitting layer and a hole transporting layer or at the interface between the light emitting layer and an electron transporting layer, and thus, the light emitting element does not deteriorate very much. In other words, the change of luminance over time is small and a light emitting element having a long lifetime can be provided.

Further, a light emitting element of the present invention is applied to light emitting devices and electronic devices, so that the light emitting devices and the electronic devices can have long lifetimes.

DETAILED DESCRIPTION OF THE INVENTION

Figure 1A:
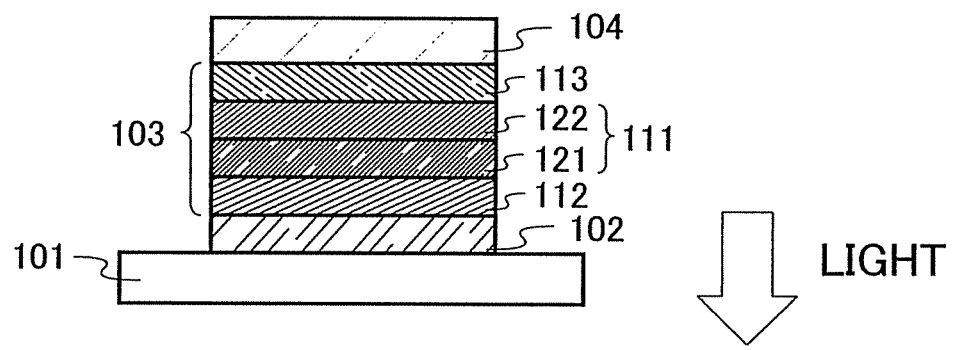
FIGS. 1A to 1C show light emitting elements according to the present invention.

Hereinafter, embodiment modes and an example of the present invention will be described with reference to the drawings. Note that the present invention is not limited to the description below. It is easily understood by those skilled in the art that modes and details disclosed herein can be modified in various ways without departing from the spirit and the scope of the present invention. Therefore, it is noted that the present invention should not be interpreted as being limited to the description of the embodiment modes and the example given herein.

It is to be noted that, in this specification, the word "composite" means not only a state in which two materials are simply mixed but also a state in which a plurality of materials are mixed and charges are transferred between the materials.
(Embodiment Mode 1)

One mode of a light emitting element of the present invention will be described below with reference to FIG. 1A.

The light emitting element of the present invention includes a plurality of layers between a pair of electrodes. The plurality of layers are stacked by a combination of layers including a substance with a high carrier injecting property and a substance with a high carrier transporting property so that a light emitting region is formed apart from the electrodes, in other words, recombination of carriers is performed in a portion apart from the electrodes.

In this embodiment mode, the light emitting element includes a first electrode 102, a second electrode 104, and an EL layer 103 formed between the first electrode 102 and the second electrode 104. In addition, description in this embodiment mode is carried out on the assumption that the first electrode 102 serves as an anode and the second electrode 104 serves as a cathode. In other words, description is hereinafter carried out on the assumption that light emission can be obtained when a voltage is applied to the first electrode 102 and the second electrode 104 so that a potential of the first electrode 102 is higher than that of the second electrode 104.

The substrate 101 is used as a support of the light emitting element. As the substrate 101, glass, plastic, or the like can be used, for example. Note that materials other than glass and plastic can be used as long as they can function as a support in a manufacturing process of a light emitting element.

The first electrode 102 is preferably formed of a metal, an alloy, a conductive compound, a mixture of these, or the like each having a high work function (specifically, a work function of 4.0 eV or higher). Specifically, for example, indium oxide-tin oxide (ITO: indium tin oxide), indium oxide-tin oxide including silicon or silicon oxide, indium oxide-zinc oxide (IZO: indium zinc oxide), indium oxide including tungsten oxide and zinc oxide (IWZO), and the like are given. Films of these conductive metal oxides are usually formed by sputtering; however, a sol-gel method or the like may also be used. For example, indium oxide-zinc oxide (IZO) can be formed by a sputtering method using a target in which 1 to 20 wt % of zinc oxide with respect to indium oxide is included. Moreover, indium oxide (IWZO) including tungsten oxide and zinc oxide can be formed by a sputtering method using a target in which 0.5 to 5 wt % of tungsten oxide and 0.1 to 1 wt % of zinc oxide with respect to indium oxide are included. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used.

In a case where a layer containing a composite material described below is used as a layer in contact with the first electrode, various metals, alloys, electrically conductive compounds, mixtures thereof, or the like can be used for the first electrode regardless of the work function. For example, aluminum (Al), silver (Ag), an alloy containing aluminum (e.g., AlSi), or the like can be used. Further, an element belonging to Group 1 or Group 2 in the periodic table, which is a low function material, in other words, an alkali metal such as lithium (Li) or cesium (Cs), an alkaline earth metal such as magnesium (Mg), calcium (Ca), or strontium (Sr), an alloy including these elements (e.g., MgAg, AlLi), a rare earth metal such as europium (Eu) or ytterbium (Yb), an alloy including such rare earth metals, or the like can be used. A film of an alkali metal, an alkaline earth metal, or an alloy including these can be formed by a vacuum evaporation method. A film of an alloy including an alkali metal or an alkaline earth metal can also be formed by a sputtering method. A silver paste or the like can be used to form a film, using an inkjet method or the like.

There is no particular limitation on the stacked structure of the EL layer 103, and layers formed of a substance with a high electron transporting property, a substance with a high hole transporting property, a substance with a high electron injecting property, a substance with a high hole injecting property, a bipolar substance (a substance with high electron transporting and hole transporting properties) and/or the like may be combined as appropriate with a light emitting layer to be described in this embodiment mode. For example, a hole injecting layer, a hole transporting layer, a hole blocking layer, a light emitting layer, an electron transporting layer, an electron injecting layer, and/or the like can be combined as appropriate to constitute the EL layer 103. Specific materials to form each of the layers will be given below. FIGS. 1A to 1C show examples in which the first electrode 102, a hole transporting layer 112, a light emitting layer 111, an electron transporting layer 113, and the second electrode 104 are sequentially stacked.

A hole injecting layer may be formed between the first electrode 102 and the hole transporting layer 112. The hole injecting layer is a layer having a substance with a high hole injecting property. As the substance with a high hole injecting property, molybdenum oxide, vanadium oxide, ruthenium oxide, tungsten oxide, manganese oxide, or the like may be used. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonate) (PEDOT/PSS), or the like to form the hole injecting layer.

Alternatively, as the hole injecting layer, a composite material in which an acceptor substance is mixed into a substance with a high hole transporting property can be used. It is to be noted that, by using such a composite material in which an acceptor substance is mixed into a substance with a high hole transporting property, a material for forming an electrode can be selected regardless of the work function. In other words, besides a material with a high work function, a material with a low work function may also be used for the first electrode 102. As the acceptor substance, 7,7,8,8-tetracyano-2,3,5,6-tetrafluoroquinodimethane (abbr.: $F_4$-TCNQ), chloranil, and the like can be given. In addition, a transition metal oxide can be given. In addition, oxides of metals that belong to Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable since their electron accepting properties are high. Among them, molybdenum oxide is especially preferable since it is stable in the air, has a low hygroscopic property, and is easily treated.

As an organic compound used for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole transporting property. Specifically, a substance having a hole mobility of $10^{-6}$ cm$^2$/Vs or higher is preferably used. However, other substances than the above-described materials may also be used as long as the substances have higher hole transporting properties than electron transporting properties. The organic compounds which can be used for the composite material will be specifically shown below.

For example, the following can be given as the aromatic amine compound: 4,4'-bis[N-(1-naphthyl)-N-phenylamino]biphenyl (abbr.: NPB); N,N'-bis(3-methylphenyl)-N,N'-diphenyl-[1,1'-biphenyl]-4,4'-diamine (abbr.: TPD); 4,4',4''-tris(N,N-diphenylamino)triphenylamine (abbr.: TDATA); 4,4',4''-tris[N-(3-methylphenyl)-N-phenylamino]triphenylamine (abbr.: MTDATA); 4,4'-bis[N-(spiro-9,9'-bifluoren-2-yl)-N-phenylamino]biphenyl (abbr.: BSPB); and the like. Further, the followings can be given as the aromatic amine compound: N,N-bis(4-methylphenyl)(p-tolyl)-N,N-diphenyl-p-phenylenediamine (abbr.: DTDPPA); 4,4'-bis[N-(4-diphenylaminophenyl)-N-phenylamino]biphenyl (abbr.: DPAB); 4,4'-bis(N-{4-[N'-(3-methylphenyl)-N'-phenylamino]phenyl}-N-phenylamino)biphenyl (abbr.: DNTPD); 1,3,5-tris[N-(4-diphenylaminophenyl)-N-phenylamino]benzene (abbr.: DPA3B); and the like.

As carbazole derivatives which can be used for the composite material, the following can be given specifically: 3-[N-(9-phenylcarbazol-3-yl)-N-phenylamino]-9-phenylcarbazole (abbr.: PCzPCA1); 3,6-bis[N-(9-phenylcarbazol-3-yl)-N-phenylamino]-9-phenylcarbazole (abbr.: PCzPCA2); 3-[N-(1-naphthyl)-N-(9-phenylcarbazol-3-yl)amino]-9-phenylcarbazole (abbr.: PCzPCN1); and the like.

Moreover, as carbazole derivatives which can be used for the composite material, 4,4'-di(N-carbazolyl)biphenyl (abbr.: CBP); 1,3,5-tris[4-(N-carbazolyl)phenyl]benzene (abbr.: TCPB); 9-[4-(10-phenyl-9-anthryl)phenyl]-9H-carbazole (abbr.: CzPA); 1,4-bis[4-(N-carbazolyl)phenyl]-2,3,5,6-tetraphenylbenzene; or the like can also be used.

As aromatic hydrocarbon which can be used for the composite material, the following can be given for example: 2-tert-butyl-9,10-di(2-naphthyl)anthracene (abbr.: t-BuDNA); 2-tert-butyl-9,10-di(1-naphthyl)anthracene, 9,10-bis(3,5-diphenylphenyl)anthracene (abbr.: DPPA); 2-tert-butyl-9,10-bis(4-phenylphenyl)anthracene (abbr.: t-BuDBA); 9,10-di(2-naphthyl)anthracene (abbr.: DNA); 9,10-diphenylanthracene (abbr.: DPAnth); 2-tert-butylanthracene (abbr.: t-BuAnth); 9,10-bis(4-methyl-1-naphthyl)anthracene (abbr.: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. The aromatic hydrocarbon which has a hole mobility of $1 \times 10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbr.: DPVBi); 9,10-bis[4-(2,2-diphenylvinyl)phenyl]anthracene (abbr.: DPVPA); and the like.

Moreover, a high molecular compound such as poly(N-vinylcarbazole) (abbr.: PVK), poly(4-vinyltriphenylamine) (abbr.: PVTPA), poly[N-(4-{N'-[4-(4-diphenylamino)phenyl]phenyl-N'-phenylamino}phenyl)methacrylamide] (abbr.: PTPDMA), or poly[N,N'-bis(4-butylphenyl)-N,N-bis(phenyl)benzidine (abbr.: poly-TPD) can also be used.

The hole transporting layer 112 is a layer that contains a substance with a high hole transporting property. As the substance with a high hole transporting property, for example, an aromatic amine compound such as 4,4'-bis[N-(1-naphthyl)-N-phenylamino]biphenyl (abbr.: NPB or α-NPD), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), or 4,4'-bis[N-(spiro-9,9'-bifluoren-2-yl)-N-phenylamino]biphenyl (abbr.: BSPB) or the like can be used. These substances are mainly substances each having a hole mobility of $10^{-6}$ cm$^2$/Vs or higher. However, other substances than these substances may also be used as long as the substances have hole transporting properties higher than electron transporting properties. The layer containing a substance with a high hole transporting property is not limited to a single layer, and two or more layers containing the aforementioned substances may be stacked.

Further, a high molecular compound such as poly(N-vinylcarbazole) (abbr: PVK) or poly(4-vinyltriphenylamine) (abbr.: PVTPA) can also be used for the hole transporting layer.

The light emitting layer 111 is a layer including a substance having a high light emitting property. In the light emitting element of the present invention, the light emitting layer includes a first layer 121 and a second layer 122. The first layer 121 includes a first organic compound and an organic compound having a hole transporting property, and the second layer 122 includes the first organic compound and an organic compound having an electron transporting property. The first layer is provided on the first electrode side of the second layer, in other words, on the anode side of the second layer.

The first organic compound and the second organic compound is a substance having a high light emitting property, and various materials can be used. Specifically, the following materials can be used: such as N,N"-dimethylquinacridone (abbr.: DMQd); N,N'-diphenylquinacridone (abbr.: DPQd); coumarin 6; coumarin 545T; (2-{2-[4-(dimethylamino)phenyl]ethenyl}-6-methyl-4H-pyran-4-ylidene)propanedinitrile (abbr.: DCM1); {2-methyl-6-[2-(2,3,6,7-tetrahydro-H,5H-benzo[ij]quinolizin-9-yl)ethenyl]-4H-pyran-4-ylidene}propanedinitrile (abbr.: DCM2); {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbr.: DCJTB); 5,12-diphenyltetracene (abbr.: DPT); 4-(9H-carbazol-9-yl)-4'-(10-phenyl-9-anthryl)triphenylamine (abbr.: YGAPA); 4,4'-(2-tert-butylanthracen-9,10-diyl)bis{N-[4-(9H-carbazol-9-yl)phenyl]-N-phenylaniline} (abbr.: YGABPA); N,9-diphenyl-N-[4-(10-phenyl-9-anthryl)phenyl]-9H-carbazol-3-amine (abbr.: PCAPA); N,N"-(2-tert-butylanthracene-9,10-diyldi-4,1-phenylene)bis[N,N',N'-triphenyl-1,4-phenylenediamine] (abbr.: DPABPA); N,N'-bis[4-(9H-carbazol-9-yl)phenyl]-N,N'-diphenylstilbene-4,4'-diamine (abbr: YGA2S); N-[4-(9H-carbazol-9-yl)phenyl]-N-phenyl-stilbene-4-amine (abbr: YGAS); N,N'-diphenyl-N,N'-bis(9-phenylcarbazol-3-yl)stilbene-4,4'-diamine (abbr.: PCA2S); 4,4'-bis(2,2-diphenylvinyl)biphenyl (abbr.: DPVBi); 2,5,8,11-tetra(tert-butyl)perylene (abbr.: TBP); perylene; rubrene; 1,3,6,8-tetraphenylpyrene; or the like.

The organic compound having a hole transporting property included in the first layer 121 is a substance which exhibits a hole transporting property higher than an electron transporting property. The organic compound having an electron transporting property included in the second layer 122 is a substance which exhibits an electron transporting property higher than a hole transporting property.

Figure 1B:
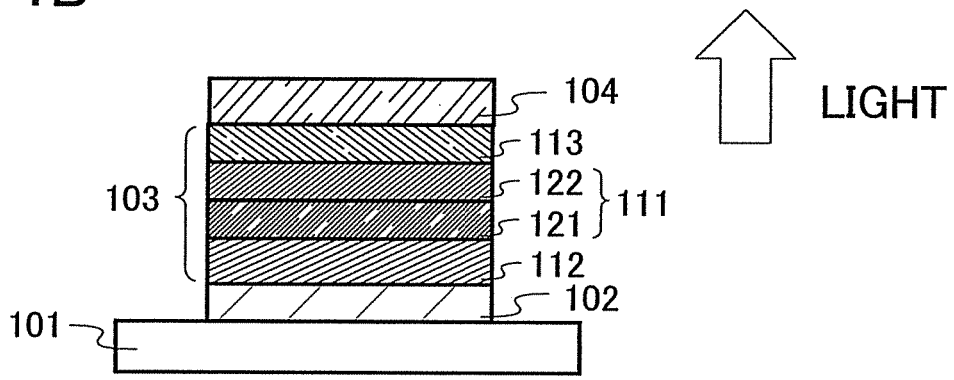
Figure 1C:
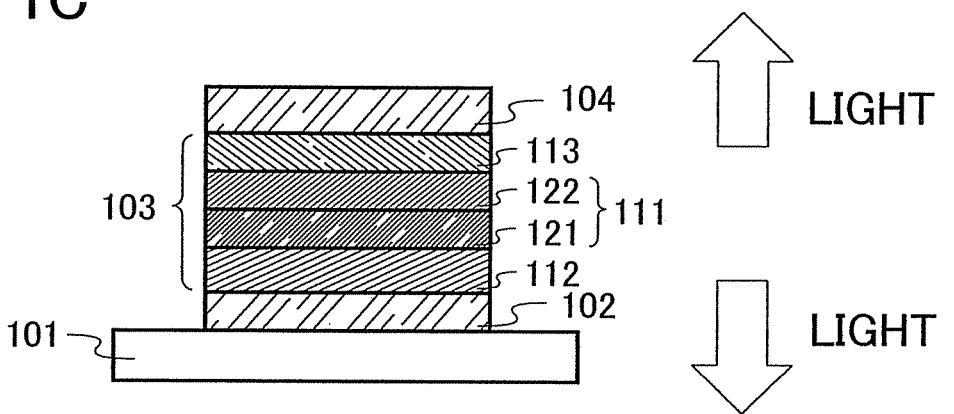
Figure 10:
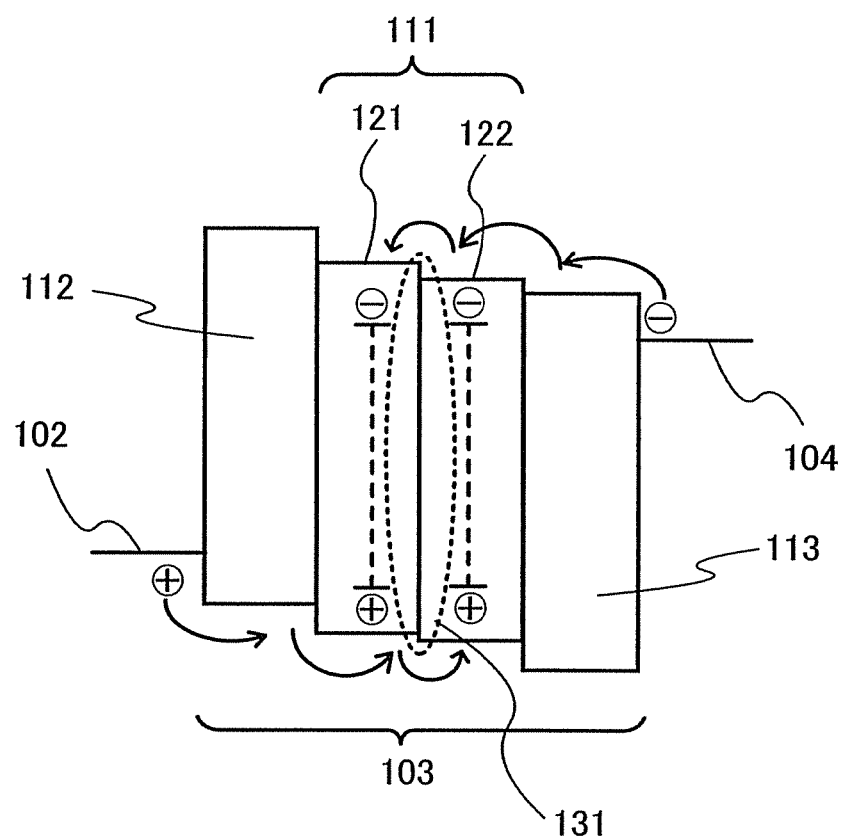
FIG. 10 shows energy levels of a light emitting element according to the present invention.

Here, FIG. 10 shows an example of a band diagram of a light emitting element of the present invention illustrated in FIGS. 1A to 1C. In FIG. 10, holes injected from the first electrode 102 are injected into the first layer 121. The holes injected into the first layer 121 are transported through the first layer 121 and further injected into the second layer 122. Here, the organic compound having an electron transporting property included in the second layer 122 is a substance which exhibits a higher electron transporting property than a hole transporting property, and thus, the holes injected into the second layer 122 become difficult to move. Consequently, a large number of holes are present near the interface between the first layer 121 and the second layer 122. In addition, occurrence of a phenomenon in which holes reach the electron transporting layer 113 without being recombined with electrons can be suppressed.

On the other hand, electrons injected from the second electrode 104 are injected into the second layer 122. The electrons injected into the second layer 122 are transported through the second layer 122 and further injected into the first layer 121. Here, the organic compound having a hole transporting property included in the first layer 121 is a substance which exhibits a higher hole transporting property than an electron transporting property, and thus, the electrons injected into the first layer 121 become difficult to move. Consequently, a large number of electrons are present near the interface between the first layer 121 and the second layer 122. In addition, occurrence of a phenomenon in which electrons reach the hole transporting layer 112 without being recombined with holes can be suppressed.

As described above, a large number of holes and electrons are present in a region 131 in the vicinity of the interface between the first layer 121 and the second layer 122, so that recombination probability can be increased in the region 131 in the vicinity of the interface. In other words, the light emitting region is formed in the vicinity of the center of the light emitting layer 111. As a result, occurrence of a phenomenon in which holes reach the electron transporting layer 113 without being recombined with electrons or electrons reach the hole transporting layer 112 without being recombined with holes can be suppressed, so that reduction in recombination probability can be prevented. Thus, reduction of carrier balance over time can be prevented, which leads to improvement of reliability.

In order that holes and electrons are injected into the first layer 121, it is necessary that the organic compound having a hole transporting property is an organic compound which can be oxidized and reduced. Thus, the highest occupied molecular orbital level (HOMO level) of the organic compound having a hole transporting property is preferably greater than or equal to −6.0 eV and less than or equal to −5.0 eV. In addition, the lowest unoccupied molecular orbital level (LUMO level) of the organic compound having a hole transporting property is preferably greater than or equal to −3.0 eV and less than or equal to −2.0 eV.

Similarly, in order that holes and electrons are injected into the second layer 122, it is necessary that the organic compound having an electron transporting property is an organic compound which can be oxidized and reduced. Thus, the highest occupied molecular orbital level (HOMO level) of the organic compound having an electron transporting property is preferably greater than or equal to −6.0 eV and less than or equal to −5.0 eV. In addition, the lowest unoccupied molecular orbital level (LUMO level) of the organic compound having an electron transporting property is preferably greater than or equal to −3.0 eV and less than or equal to −2.0 eV.

As described above with reference to FIG. 10, the light emitting element of the present invention is structured so that holes are injected into the second layer 122 from the first layer 121. Thus, the difference between the highest occupied molecular orbital level (HOMO level) of the organic compound having a hole transporting property and the highest occupied molecular orbital level (HOMO level) of the organic compound having an electron transporting property is preferably small. Further, the light emitting element of the present invention is structured so that electrons are injected into the first layer 121 from the second layer 122. Thus, the difference between the lowest unoccupied molecular orbital level (LUMO level) of the organic compound having a hole transporting property and the lowest unoccupied molecular orbital level (LUMO level) of the organic compound having an electron transporting property is preferably small. If the difference between the HOMO level of the organic compound having a hole transporting property and the HOMO level of the organic compound having an electron transporting property is large, the light emitting region is formed more on the first layer side or the second layer side. Similarly, if the difference between the LUMO level of the organic compound having a hole transporting property and the LUMO level of the organic compound having an electron transporting property is large, the light emitting region is formed more on the first layer side or the second layer side. Accordingly, the difference between the highest occupied molecular orbital level (HOMO level) of the organic compound having a hole transporting property and the highest occupied molecular orbital level (HOMO level) of the organic compound having an electron transporting property is preferably 0.3 eV or less, and more preferably 0.1 eV or less. In addition, the difference between the lowest unoccupied molecular orbital level (LUMO level) of the organic compound having a hole transporting property and the lowest unoccupied molecular orbital level (LUMO level) of the organic compound having an electron transporting property is preferably 0.3 eV or less, and more preferably 0.1 eV or less.

Further, the light emitting element provides light emission by recombination of electrons and holes, and thus, the organic compound used in the light emitting layer 111 is preferably stable even when an oxidative reaction and a reductive reaction are repeated. In other words, the organic compound is preferably reversible to the oxidative reaction and the reductive reaction. In particular, the organic compound having a hole transporting property and the organic compound having an electron transporting property are preferably stable even when an oxidative reaction and a reductive reaction are repeated. It can be confirmed by employing the cyclic voltammetry (CV) measurement whether the organic compounds are stable when an oxidative reaction and a reductive reaction are repeated.

Specifically, changes of an oxidation peak potential ($E_{pa}$) in the oxidative reaction of the organic compound or a reduction peak potential ($E_{pc}$) in the reductive reaction, changes of the peak shape, and the like are observed, thereby confirming whether the organic compounds are stable when the oxidative reaction and the reductive reaction are repeated. In the organic compound having a hole transporting property and the organic compound having an electron transporting property used for the light emitting layer 111, the changes in the intensity of the oxidation peak potential and the intensity of the reduction peak potential are preferably less than 50%, and more preferably less than 30%. In other words, for example, a peak intensity of 50% or higher is preferably kept even when the oxidation peak potential decreases. More preferably, a peak intensity of 70% or higher is kept. In addition, the changes of the values of the oxidation peak potential and the reduction peak potential are preferably 0.05 V or lower. More preferably, the changes are 0.02 V or lower.

At least one of either the organic compound having a hole transporting property included in the first layer 121 and the organic compound having an electron transporting property included in the second layer 122, is a high molecular compound. Because of this, at least one of the first layer 121 and the second layer 122 can be formed by a wet process. Accordingly, in the case where the light emitting element of the present invention is applied to a display device such as a full-color display and separate coloring of light emitting layers is necessary, the separate coloring of the light emitting layers becomes easy and productivity is improved. In addition, since the material use efficiency is increased, cost reduction is possible. It is particularly preferable that both the organic compound having a hole transporting property included in the first layer 121 and the organic compound having an electron transporting property included in the second layer 122 are high molecular compounds because the first layer 121 and the second layer 122 can be formed by a wet process.

As the organic compound having a hole transporting property included in the first layer 121, for example, a high molecular compound such as poly(N-vinylcarbazole) (abbr.: PVK); poly(4-vinyltriphenylamine) (abbr.: PVTPA); poly[N-(4-{N'-[4-(4-diphenylamino)phenyl]phenyl-N'-phenylamino}phenyl)methacrylamide] (abbr.: PTPDMA); or poly[N,N'-bis(4-butylphenyl)-N,N'-bis(phenyl)benzidine] (abbr.: Poly-TPD) can be used.

As the organic compound having an electron transporting property included in the second layer 122, for example, a high molecular compound such as poly[(9,9-dihexylfluorene-2,7-diyl)-co-(pyridin-3,5-diyl)] (abbr.: PF-Py) or poly[(9,9-dioctylfluorene-2,7-diyl)-co-(2,2'-bipyridin-6,6'-diyl)] (abbr.: PF-BPY) can be used.

When a high molecular compound such as the above-described PVK, PVTPA, PTPDMA, or Poly-TPD is used as the organic compound having a hole transporting property included in the first layer 121, not only the high molecular compound such as the above-described PF-Py or PF-BPy but also a low molecular compound such as 9-[4-(10-phenyl-9-anthryl)phenyl]-9H-carbazole (abbr.: CzPA); 3,6-diphenyl-9-[4-(10-phenyl-9-anthryl)phenyl]-9H-carbazole (abbr.: DPCzPA); 9,10-bis(3,5-diphenylphenyl)anthracene (abbr.: DPPA); 9,10-di(2-naphthyl)anthracene (abbr.: DNA); 2-tert-butyl-9,10-di(2-naphthyl)anthracene (abbr.: t-BuDNA); 9,9'-bianthryl (abbr: BANT); 9,9'-(stilben-3,3'-diyl)diphenanthrene (abbr.: DPNS); 9,9'-(stilben-4,4'-diyl)diphenanthrene (abbr.: DPNS2); or 3,3',3"-(benzene-1,3,5-triyl)tripyrene (abbr.: TPB3) can be used as the organic compound having an electron transporting property included in the second layer 122. In the case of using the low molecular compound, vacuum evaporation is possible. Therefore, there is a merit that stacking of the low molecular compound with the high molecular compound is easy.

When a high molecular compound such as the above-described PF-Py or PF-BPy is used as the organic compound having an electron transporting property included in the second layer 122, not only the high molecular compound such as the above-described PVK, PVTPA, PTPDMA, or Poly-TPD but also a low molecular compound such as 9,10-diphenylanthracene (abbr.: DPAnth); N,N-diphenyl-9-[4-(10-phenyl-9-anthryl)phenyl]-9H-carbazol-3-amine (abbr.: CzAlPA); 4-(10-phenyl-9-anthryl)triphenylamine (abbr.: DPhPA); N,9-diphenyl-N-[4-(10-phenyl-9-anthryl)phenyl]-9H-carbazol-3-amine (abbr.: PCAPA); N,9-diphenyl-N-{4-[4-(10-phenyl-9-anthryl)phenyl]phenyl}-9H-carbazol-3-amine (abbr.: PCAPBA); 6,12-dimethoxy-5,11-diphenylchrysene; or N,N,N',N',N",N",N''',N'''-octaphenyldibenzo[g,p]chrysene-2,7,10,15-tetraamine can be used as the organic compound having a hole transporting property included in the first layer 121. In the case of using the low molecular compound, vacuum evaporation is possible. Therefore, there is a merit that stacking of the low molecular compound with the high molecular compound is easy.

The same substance is used for the substance having a high light emitting property included in the first layer and the substance having a high light emitting property included in the second layer, thereby making it possible to emit light in the vicinity of the center of the light emitting layer. On the other hand, if different substances having high light emitting properties are used for the first layer and the second layer, there is a possibility that light is emitted from only one of the first layer and the second layer. Therefore, the substance having a high light emitting property included in the first layer and the substance having a high light emitting property included in the second layer are preferably the same.

The electron transporting layer 113 is a layer that contains a substance with a high electron transporting property. For example, a layer containing a metal complex having a quinoline skeleton or a benzoquinoline skeleton, such as tris(8-quinolinolato)aluminum (abbr.: Alq); tris(4-methyl-8-quinolinolato)aluminum (abbr.: Almq3); bis(10-hydroxybenzo[h]-quinolinato)beryllium (abbr.: BeBq$_2$); or bis(2-methyl-8-quinolinolato)(4-phenylphenolato)aluminum (abbr.: BAlq), or the like can be used. Alternatively, a metal complex having an oxazole-based or thiazole-based ligand, such as bis[2-(2-hydroxyphenyl)benzoxazolato]zinc (abbr.: Zn(BOX)$_2$) or bis[2-(2-hydroxyphenyl)benzothiazolato]zinc (abbr.: Zn(BTZ)$_2$), or the like can be used. Besides the metal complexes, 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylphenyl)-1,2,4-triazole (abbr.: TAZ), bathophenanthroline (abbr.: BPhen), bathocuproine (abbr.: BCP), or the like can also be used. The substances mentioned here are mainly materials each having an electron mobility of $10^{-6}$ cm$^2$/Vs or higher. The electron transporting layer may be formed of other materials than those described above as long as the materials have electron transporting properties higher than hole transporting properties. Furthermore, the electron transporting layer is not limited to a single layer, and two or more layers made of the aforementioned substances may be stacked.

For the electron transporting layer, a high molecular compound can be used. For example, poly[(9,9-dihexylfluorene-2,7-diyl)-co-(pyridin-3,5-diyl)] (abbr.: PF-Py), poly[(9,9-dioctylfluorene-2,7-diyl)-co-(2,2'-bipyridin-6,6'-diyl)] (abbr.: PF-BPy), or the like can be used.

In addition, an electron injecting layer, which includes a substance with a high electron injecting property, may be provided between the electron transporting layer 113 and the second electrode 104. As the electron injecting layer, an alkali metal, an alkaline earth metal, or a compound thereof such as lithium fluoride (LiF), cesium fluoride (CsF), or calcium fluoride (CaF$_2$) may be used. For example, a layer of a substance having an electron transporting property containing an alkali metal, an alkaline earth metal, or a compound thereof, such as a layer of Alq which contains magnesium (Mg), may be used. A film of an alkali metal, an alkaline earth metal, or an alloy thereof can be formed by a vacuum evaporation method. A film of an alloy including an alkali metal or an alkaline earth metal can also be formed by a sputtering method. Further, a silver paste or the like can also be used to form a film, using an inkjet method or the like. By using a layer of a substance having an electron transporting property, in which an alkali metal or an alkaline earth metal is contained, as the electron injecting layer, electron injection from the second electrode 104 is performed efficiently, which is preferable.

The second electrode 104 can be formed of a metal, an alloy, an electrically conductive compound, or a mixture of these, having a low work function (specifically, a work function of 3.8 eV or lower). As a specific example of such a cathode material, an element belonging to Group 1 or Group 2 in the periodic table, i.e., an alkali metal such as lithium (Li) or cesium (Cs), or an alkaline earth metal such as magnesium (Mg), calcium (Ca), or strontium (Sr); an alloy containing any of these (such as MgAg or AlLi); a rare earth metal such as europium (Er) or ytterbium (Yb); an alloy containing such a rare earth metal; or the like can be used. However, when an electron injecting layer is provided between the second electrode 104 and the electron transporting layer, the second electrode 104 can be formed of various conductive materials such as Al, Ag, ITO, and indium oxide-tin oxide including silicon or silicon oxide regardless of its work function. A film of these conductive materials can be formed by a sputtering method, an inkjet method, a spin coating method, or the like.

As a formation method of the EL layer, various methods can be employed regardless of a wet process or a dry process. For example, a vacuum evaporation method, an inkjet method, a spin coating method, or the like may be used. A different formation method may be employed for each electrode or each layer.

For example, it is preferable to form a layer that uses a high molecular compound (in particular, the first layer 121 or the second layer 122) by a wet process. In the case of forming a layer that uses a low molecular organic compound, a wet process may be employed, or a dry process such as a vacuum evaporation method may also be employed.

Further, the electrodes may be formed by a sol-gel method, which is a wet process, or may also be formed by a wet process using a paste of a metal material. Alternatively, a dry process such as a sputtering method or a vacuum evaporation method may also be employed.

Hereinafter, a specific formation method of a light emitting element will be described. In the case where a light emitting element of the present invention is applied to a display device and separate coloring of light emitting layers is carried out, it is preferable to form the light emitting layers by a wet process. By forming the light emitting layers by a wet process such as an inkjet method, separate coloring of the light emitting layers becomes easy even when a large substrate is used.

For example, in the structure described in this embodiment mode, the first electrode may be formed by a sputtering method, which is a dry process; the hole injecting layer may be formed by an inkjet method or a spin coating method, which are wet processes; the hole transporting layer may be formed by a vacuum evaporation method, which is a dry process; the first layer may be formed by an inkjet method, which is a wet process; the second layer may be formed by a co-evaporation method, which is a dry process; the electron transporting layer and the electron injecting layer may be formed by a vacuum evaporation method, which is a dry process; and the second electrode may be formed by an inkjet method or a spin coating method, which are wet processes. Alternatively, the first electrode may be formed by an inkjet method, which is a wet process; the hole injecting layer may be formed by a vacuum evaporation method, which is a dry process; the hole transporting layer may be formed by an inkjet method or a spin coating method, which are wet processes; the first layer may be formed by an inkjet method, which is a wet process; the second layer may be formed by an inkjet method or a spin coating method, which are wet processes; the electron transporting layer and the electron injecting layer may be formed by an inkjet method or a spin coating method, which are wet processes; and the second electrode may be formed by an inkjet method or a spin coating method, which are wet processes. Without limitation to the above-described methods, a wet process and a dry process may be appropriately combined.

Further alternatively, for example, the first electrode can be formed by a sputtering method, which is a dry process; the hole injecting layer and the hole transporting layer can be formed by an inkjet method or a spin coating method, which are wet processes; the first layer can be formed by an inkjet method, which is a wet process; the second layer can be formed by a co-evaporation method, which is a dry process; the electron transporting layer and the electron injecting layer can be formed by a vacuum evaporation method, which is a dry process; and the second electrode can be formed by a vacuum evaporation method, which is a dry process. In other words, over a substrate over which the first electrode is formed with a desired shape, the hole injecting layer to the first layer can be formed by a wet process, and the second layer to the second electrode can be formed by a dry process. In this method, the hole injecting layer to the first layer can be formed at atmospheric pressure and separate coloring for the first layer is easy. In addition, the second layer to the second electrode can be formed in vacuum consistently. Therefore, the process can be simplified and productivity can be improved.

Figure 2:
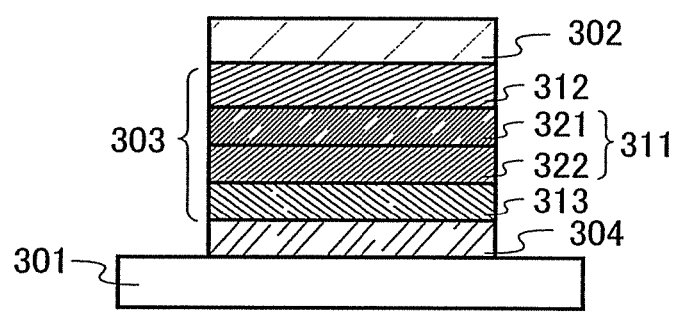
FIG. 2 shows a light emitting element according to the present invention.

In the case of the structure shown in FIG. 2, in reverse order to the above-described method, the second electrode can be formed by a sputtering method or a vacuum evaporation method, which are dry processes; the electron injecting layer to the electron transporting layer can be formed by a vacuum evaporation method, which is a dry process; the second layer can be formed by a co-evaporation method; the first layer can be formed by an inkjet method, which is a wet process; the hole transporting layer and the hole injecting layer can be formed by an inkjet method or a spin coating method, which are wet processes; and the first electrode can be formed by an inkjet method or a spin coating method, which are wet processes. In this method, the second electrode to the second layer can be formed by a dry process in vacuum consistently, and the first layer to the first electrode can be formed at atmospheric pressure. Therefore, the process can be simplified and productivity can be improved.

In the light emitting element of the present invention having the above structure, a current flows due to a potential difference generated between the first electrode 102 and the second electrode 104 and holes and electrons are recombined in the EL layer 103 so that light is emitted. More specifically, in the light emitting layer 111 in the EL layer 103, a light emitting region is formed in the vicinity of the center of the first layer 121 and the second layer 122.

The emitted light is extracted out through one or both of the first electrode 102 and the second electrode 104. Accordingly, one or both of the first electrode 102 and the second electrode 104 is/are an electrode having a light transmitting property. When only the first electrode 102 is an electrode having a light transmitting property, light is extracted from the substrate side through the first electrode 102 as illustrated in FIG. 1A. In addition, when only the second electrode 104 is an electrode having a light transmitting property, light is extracted from the opposite side to the substrate through the second electrode 104 as illustrated in FIG. 1B. Further, when the first electrode 102 and the second electrode 104 are both electrodes having light transmitting properties, light is extracted to both sides, i.e., the substrate side and the opposite side, through the first electrode 102 and the second electrode 104 as illustrated in FIG. 1C.

The structure of layers provided between the first electrode 102 and the second electrode 104 is not limited to the above example. Besides the above-described structures, any structure can be employed as long as it has a light emitting region for recombination of holes and electrons in a portion apart from the first electrode 102 and the second electrode 104 to prevent light extinction caused by adjacency of the light emitting region and a metal, and as long as a light emitting layer includes the first layer 121 and the second layer 122 in the structure.

In other words, there are no particular limitations on the stacked structure of the layers, and layers formed of a substance with a high electron transporting property, a substance with a high hole transporting property, a substance with a high electron injecting property, a substance with a high hole injecting property, a bipolar substance (a substance with high electron transporting and hole transporting properties), a hole blocking material, and the like may be freely combined with the light emitting layer of the present invention.

The light emitting element illustrated in FIG. 2 has a structure in which a second electrode 304 serving as a cathode, an EL layer 303, and a first electrode 302 serving as an anode are sequentially stacked over a substrate 301. The EL layer 303 includes a hole transporting layer 312, a light emitting layer 311, and an electron transporting layer 313, and the light emitting layer 311 includes a first layer 321 and a second layer 322. The first layer 321 is provided closer to the side of the first electrode serving as an anode than the second layer 322.

In this embodiment mode, the light emitting element is formed over a substrate made of glass, plastic, or the like. A plurality of such light emitting elements is formed over one substrate, thereby forming a passive matrix light emitting device. In addition, for example, a thin film transistor (TFT) may be formed over a substrate of glass, plastic, or the like and a light emitting element may be manufactured over an electrode that is electrically connected to the TFT. In this way, an active matrix light emitting device in which the TFT controls the drive of the light emitting element can be manufactured. It is to be noted that there is no particular limitation on the structure of the TFT. A staggered TFT or an inversely staggered TFT may be employed. In addition, a driver circuit formed over a TFT substrate may be formed using N-channel and P-channel TFTs, or using either N-channel or P-channel TFTs. Furthermore, there is no particular limitation on crystallinity of a semiconductor film used for the TFT. An amorphous semiconductor film may be used, or a crystalline semiconductor film may be used.

In the light emitting element of the present invention, a light emitting region is formed in the vicinity of the center of the light emitting layer, without being formed at the interface between the light emitting layer and the hole transporting layer or at the interface between the light emitting layer and the electron transporting layer. Thus, there are almost no influences of deterioration which would be caused when the light emitting region is adjacent to the hole transporting layer or the electron transporting layer. Therefore, a light emitting element having a long lifetime with little deterioration can be obtained. In addition, the light emitting layer of the light emitting element in the present invention is formed using a compound which is stable even when an oxidative reaction and a reductive reaction are repeated, and thus, the light emitting layer does not deteriorate very much even when light emission by recombination of electrons and holes is repeated. Accordingly, a light emitting element having a long lifetime can be obtained.

Note that this embodiment mode can be appropriately combined with any of the other embodiment modes.

(Embodiment Mode 2)

Embodiment Mode 2 will describe a mode of a light emitting element in which a plurality of light emitting units in accordance with the present invention are stacked (hereinafter, also referred to as a stacked type element) with reference to FIG. 3. This light emitting element is a light emitting element including a plurality of light emitting units between a first electrode and a second electrode.

Figure 3:
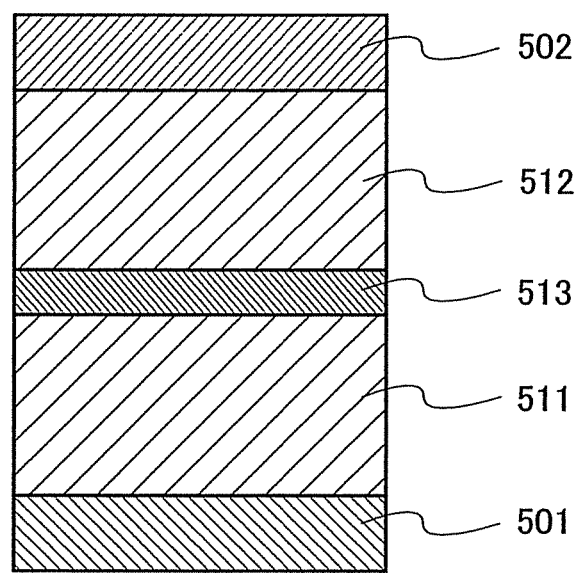
FIG. 3 shows a light emitting element according to the present invention.

In FIG. 3, a first light emitting unit 511 and a second light emitting unit 512 are stacked between a first electrode 501 and a second electrode 502. Similar electrodes to those shown in Embodiment Mode 1 can be applied to the first electrode 501 and the second electrode 502. The first light emitting unit 511 and the second light emitting unit 512 may have the same structure or different structures to each other, and as the structures, a similar structure to that shown in Embodiment Mode 1 can be employed. That is to say that the light emitting unit includes at least the first layer 121 and the second layer 122. Additionally, the light emitting unit may also include a hole transporting layer, an electron transporting layer, and the like.

A charge generation layer 513 includes a composite material of an organic compound and a metal oxide. The composite material of an organic compound and a metal oxide is the composite material shown in Embodiment Mode 1, and includes an organic compound and a metal oxide such as vanadium oxide, molybdenum oxide, or tungsten oxide. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use an organic compound which has a hole transporting property and has a hole mobility of $10^{-6}$ cm$^2$/Vs or higher. However, other substances than the materials described above may also be used as long as the substances have hole transporting properties higher than the electron transporting properties. The composite material of the organic compound and the metal oxide can achieve low-voltage driving and low-current driving because of the superior carrier injecting property and carrier transporting property.

Note that the charge generation layer 513 may be formed by combination of a composite material of the organic compound and the metal oxide with another material. For example, a layer containing a composite material of the organic compound and the metal oxide may be combined with a layer containing a compound of a substance selected from electron donating substances and a compound with a high electron transporting property. Moreover, a layer containing a composite material of the organic compound and the metal oxide may be combined with a transparent conductive film.

In any case, it is acceptable as long as the charge generation layer 513 interposed between the first light emitting unit 511 and the second light emitting unit 512 injects electrons to one of these light emitting units and holes to the other thereof when voltage is applied to the first electrode 501 and the second electrode 502.

Although this embodiment mode describes the light emitting element having two light emitting units, the present invention can be similarly applied to a light emitting element in which three or more light emitting units are stacked. When the charge generation layer is provided between the pair of electrodes so as to partition the plural light emitting units like the light emitting element of this embodiment mode, the element can have a long lifetime with a high luminance while keeping a low current density. When the light emitting element is applied for illumination, voltage drop due to resistance of an electrode material can be reduced, thereby achieving homogeneous light emission of a large area. Moreover, a light emitting device of low power consumption, which can be driven at a low voltage, can be achieved.

When the light emitting units emit light having different colors from each other, light emission of a desired color can be obtained as a whole light emitting element. For example, in a light emitting element having two light emitting units, the emission colors of the first light emitting unit and the second light emitting unit are made complementary, so that the light emitting element which emits white light as a whole element can be obtained. Note that the word "complementary" means relationship of colors in which an achromatic color is obtained when the colors are mixed. In other words, when lights obtained from substances which emit complementary colors are mixed, white emission can be obtained. In addition, the same can be applied to a light emitting element having three light emitting units. For example, when the first light emitting unit emits red light, the second light emitting unit emits green light, and the third light emitting unit emits blue light, white light can be obtained as a whole light emitting element.

Note that this embodiment mode can be appropriately combined with any of the other embodiment modes.

(Embodiment Mode 3)

Embodiment Mode 3 will describe a light emitting device having a light emitting element of the present invention.

Figure 4A:
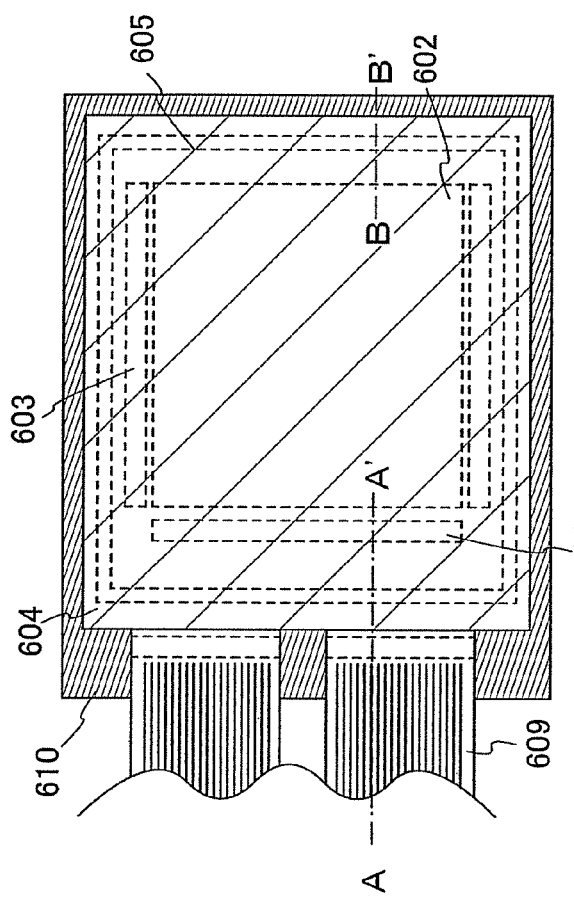
FIGS. 4A and 4B show a light emitting device according to the present invention.
Figure 4B:
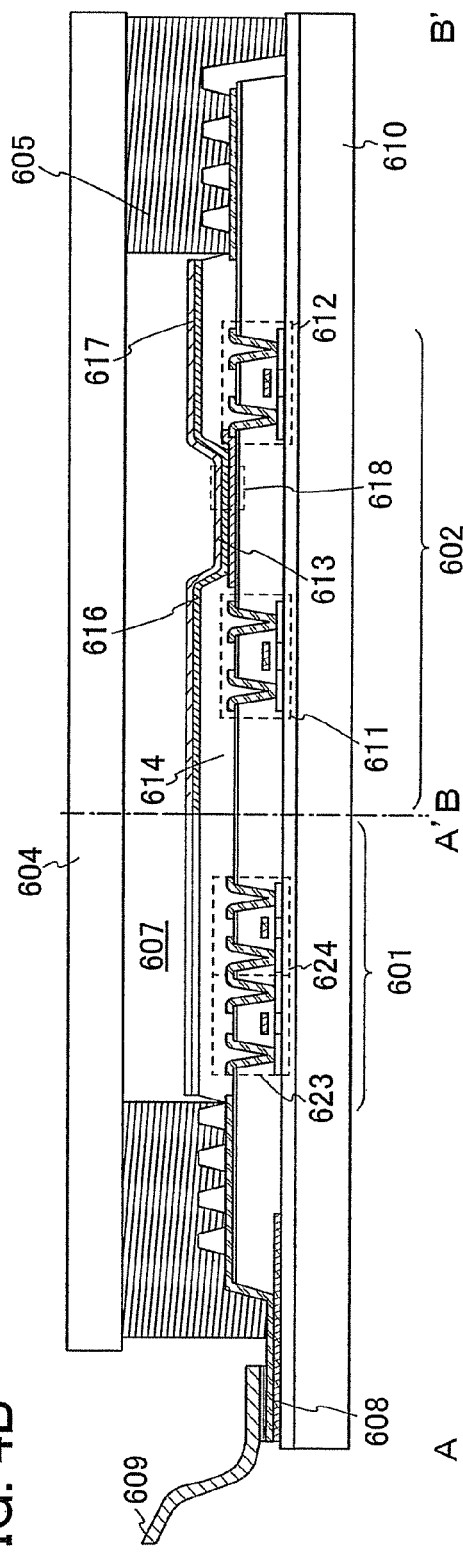

This embodiment mode will describe a light emitting device having a light emitting element of the present invention in a pixel portion, with reference to FIGS. 4A and 4B. FIG. 4A is a top view illustrating a light emitting device while FIG. 4B is a cross-sectional view taken along lines A-A' and B-B' of FIG. 4A. Reference numeral 601 denotes a driver circuit portion (source side driver circuit); 602, a pixel portion; and 603, a driver circuit portion (gate side driver circuit), which are shown with dotted lines. Moreover, reference numeral 604 denotes a sealing substrate; 605, a sealing material; and 607, a space surrounded by the sealing material 605.

A leading wire 608 is a wire to transmit a signal to be input to the source side driver circuit 601 and the gate side driver circuit 603, and receive a video signal, a clock signal, a start signal, a reset signal, and the like from an FPC (flexible printed circuit) 609, which serves as an external input terminal. Although only the FPC is shown here, this FPC may be provided with a printed wiring board (PWB). The light emitting device in this specification not only includes a light emitting device itself but also includes a state where the light emitting device has an FPC or a PWB attached thereto.

Next, a cross-sectional structure is described with reference to FIG. 4B. The driver circuit portion and the pixel portion are formed over an element substrate 610. Here, the source side driver circuit 601, which is the driver circuit portion, and one pixel in the pixel portion 602 are shown.

In the source side driver circuit 601, a CMOS circuit in which an n-channel TFT 623 and a p-channel TFT 624 are combined is formed. Such a driver circuit may be formed by using various circuits such as a CMOS circuit, a PMOS circuit, and an NMOS circuit. Although this embodiment mode illustrates a driver-integrated type where the driver circuit is formed over the substrate, the present invention is not limited to this, and the driver circuit may be formed outside the substrate, not over the substrate.

The pixel portion 602 is formed by a plurality of pixels each including a switching TFT 611, a current control TFT 612, and a first electrode 613 electrically connected to a drain of the current control TFT 612. An insulator 614 is formed so as to cover an end portion of the first electrode 613. Here, the insulator 614 is formed by using a positive photosensitive acrylic resin film.

In order to improve coverage, an upper end portion or a lower end portion of the insulator 614 is formed so as to have a curved surface with a curvature. For example, in the case of using a positive photosensitive acrylic for the insulator 614, only the upper end portion of the insulator 614 preferably has a curved surface with a radius of curvature (0.2 to 3 μm). As the insulator 614, either a negative type which becomes insoluble in etchant by irradiation with light or a positive type which becomes soluble in etchant by irradiation with light can be used.

Over the first electrode 613, an EL layer 616 and a second electrode 617 are formed. Here, the first electrode 613 can be formed with various metals, alloys, electrically conductive compounds, or mixtures thereof. If the first electrode is used as an anode, it is preferable to use, among those materials, a metal, alloy, electrically conductive compound, or mixture thereof having a high work function (work function of 4.0 eV or higher), or the like. For example, a single layer of indium oxide-tin oxide containing silicon, indium oxide-zinc oxide, a titanium nitride film, a chromium film, a tungsten film, a Zn film, a Pt film, or the like can be used. Moreover, a multilayer including a titanium nitride film and a film containing aluminum as its main component; a three-layer structure including a titanium nitride film, a film containing aluminum as its main component, and a titanium nitride film; or the like can be used. The multilayer structure achieves to have low wiring resistance, favorable ohmic contact, and a function as an anode.

The EL layer 616 is formed by various methods such as an evaporation method using an evaporation mask, an inkjet method, a spin coating method, and the like. The EL layer 616 includes the light emitting layer described in Embodiment Mode 1 or Embodiment Mode 2. As another material that constitutes a part of the EL layer 616, a low molecular material, oligomer, dendrimer, or a high molecular material may be used. As the material for the EL layer, not only an organic compound but also an inorganic compound may be used.

As the material for the second electrode 617, various metals, alloys, electrically conductive compounds, mixtures of these, or the like can be used. If the second electrode is used as a cathode, it is preferable to use, among them, a metal, alloy, electrically conductive compound, mixture of these, or the like having a low work function (work function of 3.8 eV or lower). As an example, an element belonging to Group 1 or Group 2 in the periodic table, i.e., an alkali metal such as lithium (Li) or cesium (Cs), an alkaline earth metal such as magnesium (Mg), calcium (Ca), or strontium (Sr), an alloy containing any of these (such as MgAg or AlLi), or the like can be given. In the case where light generated in the EL layer 616 is transmitted through the second electrode 617, the second electrode 617 is preferably formed by using a multilayer of a metal thin film whose thickness is made thin, and a transparent conductive film (indium oxide-tin oxide (ITO), indium oxide-tin oxide including silicon or silicon oxide, indium oxide-zinc oxide (IZO), indium oxide containing tungsten oxide and zinc oxide (IWZO), or the like).

When the sealing substrate 604 and the element substrate 610 are attached to each other by the sealing material 605, the light emitting element 618 is provided in the space 607 surrounded by the element substrate 610, the sealing substrate 604, and the sealing material 605. The space 607 is filled with filler, and may be filled with an inert gas (such as nitrogen or argon), the sealing material 605, or the like.

An epoxy-based resin is preferable for the sealing material 605. The material preferably allows as little moisture and oxygen as possible to penetrate. As a material for the sealing substrate 604, a plastic substrate made of FRP (fiberglass-reinforced plastics), PVF (polyvinyl fluoride), polyester, acrylic, or the like can be used besides a glass substrate or a quartz substrate.

In this way, the light emitting device having the light emitting element of the present invention can be obtained.

The light emitting device of the present invention includes the light emitting element described in Embodiment Mode 1 or Embodiment Mode 2. Thus, the light emitting device can have a long lifetime.

Figure 5:
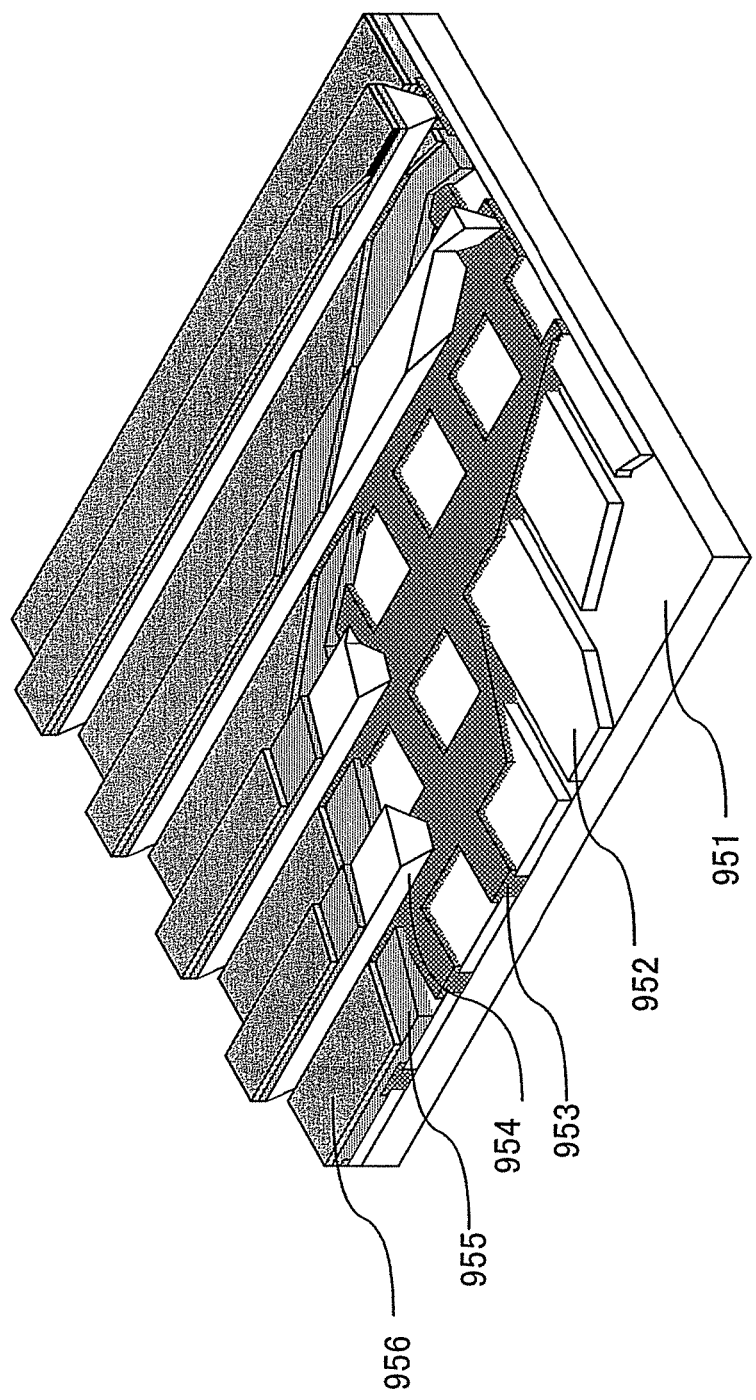
FIG. 5 shows a light emitting device according to the present invention.

Although this embodiment mode has described the active matrix type light emitting device in which the driving of the light emitting element is controlled by a transistor, the light emitting device may be of a passive type. FIG. 5 is a perspective view of a passive matrix type light emitting device manufactured by applying the present invention. In FIG. 5, an EL layer 955 is provided between an electrode 952 and an electrode 956 over a substrate 951. An end portion of the electrode 952 is covered with an insulating layer 953. Then, a partition layer 954 is provided over the insulating layer 953. Side walls of the partition layer 954 have such a gradient that the distance becomes shorter between one side wall and the other side wall as they approach the substrate surface. That is to say, a cross section of the partition layer 954 in a short-side direction is trapezoid-like, in which a bottom side (a side in a similar direction to a surface direction of the insulating layer 953, which is in contact with the insulating layer 953) is shorter than an upper side (a side in a similar direction to the surface direction of the insulating layer 953, which is not in contact with the insulating layer 953). In this way, by providing the partition layer 954, a problem of defects in a light emitting element due to electrostatic and the like can be prevented. Also, a passive matrix type light emitting device having a long lifetime can be obtained by including a light emitting element of the present invention that has a long lifetime.

(Embodiment Mode 4)

Embodiment Mode 4 will describe electronic devices of the present invention, which include the light emitting device described in Embodiment Mode 3 as a part thereof. The electronic devices of the present invention each have the light emitting element described in Embodiment Mode 1 or Embodiment Mode 2, and a display portion having a long lifetime.

As the electronic device manufactured using the light emitting device of the present invention, cameras such as video cameras or digital cameras, goggle-type displays, navigation systems, audio reproducing devices (such as car audio components or audio components), computers, game machines, mobile information terminals (mobile computers, cellular phones, mobile game machines, or electronic books), image reproducing devices equipped with a recording medium (specifically, devices equipped with a display device for reproducing a recording medium such as digital versatile disk (DVD) and displaying the image), and the like are given. Specific examples of these electronic devices are shown in FIGS. 6A to 6D.

Figure 6A:
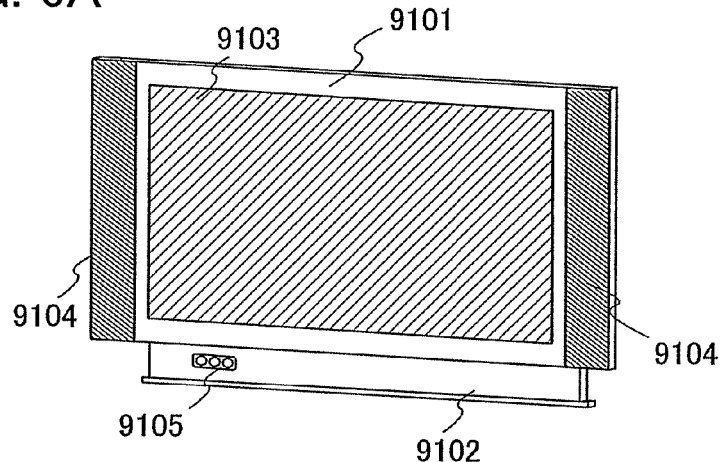
FIGS. 6A to 6D show electronic devices according to the present invention.

FIG. 6A shows a television device according to the present invention, which includes a housing 9101, a support 9102, a display portion 9103, a speaker portion 9104, a video input terminal 9105, and the like. In this television device, the display portion 9103 is formed by arranging similar light emitting elements to those described in Embodiment Modes 1 and 2 in a matrix form. The light emitting elements have an advantage of long lifetime. Since the display portion 9103 formed using the light emitting elements also has the similar advantage, this television device has a long lifetime. In other words, the television device which can endure long use can be provided.

Figure 6B:
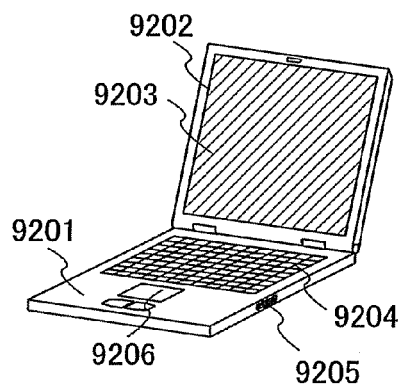

FIG. 6B shows a computer according to the present invention, which includes a main body 9201, a housing 9202, a display portion 9203, a keyboard 9204, an external connection port 9205, a pointing device 9206, and the like. In this computer, the display portion 9203 is formed by arranging similar light emitting elements to those described in Embodiment Modes 1 and 2 in a matrix form. The light emitting elements have an advantage of long lifetime. Since the display portion 9203 formed using the light emitting elements also has the similar advantage, this computer has a long lifetime. In other words, the computer which can endure long use can be provided.

Figure 6C:
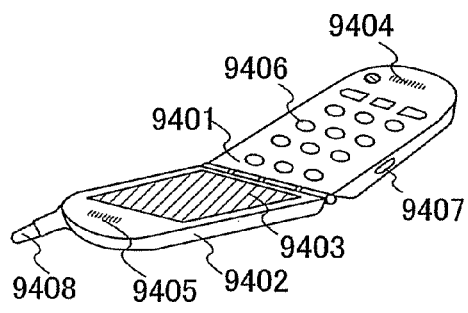

FIG. 6C shows a cellular phone according to the present invention, which includes a main body 9401, a housing 9402, a display portion 9403, an audio input portion 9404, an audio output portion 9405, an operation keys 9406, an external connection port 9407, an antenna 9408, and the like. In this cellular phone, the display portion 9403 is formed by arranging similar light emitting elements to those described in Embodiment Modes 1 and 2 in a matrix form. The light emitting elements have an advantage of long lifetime. Since the display portion 9403 formed using the light emitting elements also has the similar advantage, this cellular phone has a long lifetime. In other words, the cellular phone which can endure long use can be provided.

Figure 6D:
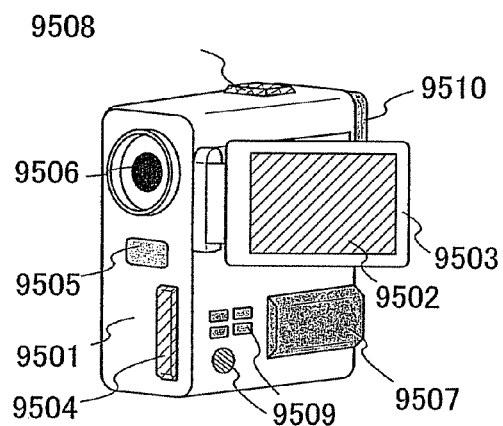

FIG. 6D shows a camera according to the present invention, which includes a main body 9501, a display portion 9502, a housing 9503, an external connection port 9504, a remote control receiving portion 9505, an image receiving portion 9506, a battery 9507, an audio input portion 9508, an operation key 9509, an eyepiece portion 9510, and the like. In this camera, the display portion 9502 is formed by arranging similar light emitting elements to those described in Embodiment Modes 1 and 2 in a matrix form. The light emitting elements have an advantage of long lifetime. Since the display portion 9502 formed using the light emitting elements also has the similar advantage, this camera has a long lifetime. In other words, the camera which can endure long use can be provided.

As thus described, application range of the light emitting device of the present invention is quite wide, and this light emitting device can be applied to electronic devices of every field. By using the light emitting device of the present invention, an electronic device having a display portion with a long lifetime which can endure long use can be provided.

Moreover, the light emitting device of the present invention can be used as an illumination device. An example of using the light emitting element of the present invention as an illumination device will be described with reference to FIG. 7.

Figure 7:
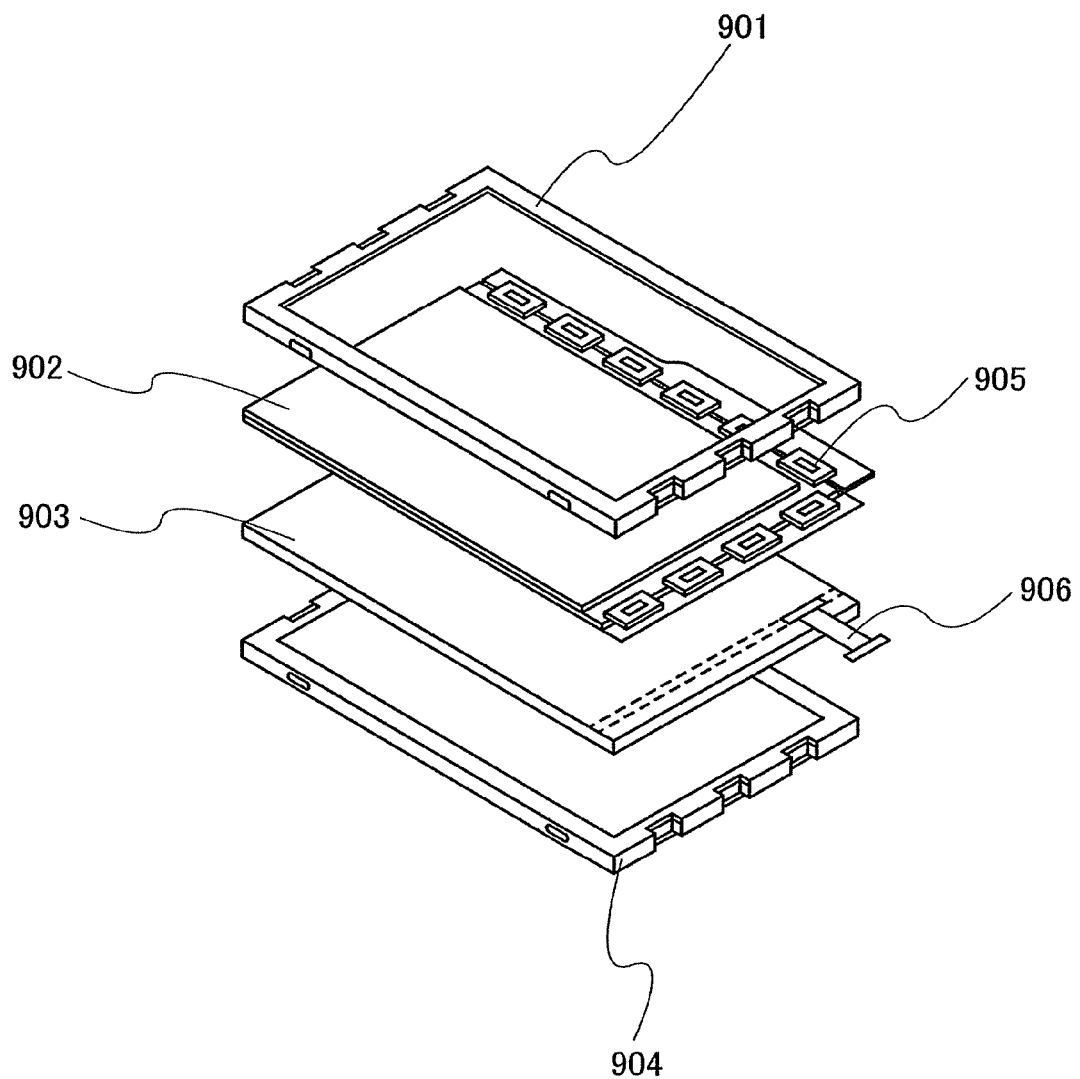
FIG. 7 shows an electronic device according to the present invention.

FIG. 7 shows an example of a liquid crystal display device in which the light emitting device of the present invention is used as a backlight. The liquid crystal display device shown in FIG. 7 includes a housing 901, a liquid crystal layer 902, a backlight 903, and a housing 904, in which the liquid crystal layer 902 is connected to a driver IC 905. The backlight 903 uses the light emitting device of the present invention, and current is supplied to the backlight 903 through a terminal 906.

When the light emitting device of the present invention is used as the backlight of the liquid crystal display device, the backlight having a long lifetime can be obtained. Moreover, since the light emitting device of the present invention is an illumination device of surface light emission and the enlargement of the light emitting device is possible, the backlight can be made larger and the liquid crystal display device can also have a larger area. Moreover, since the light emitting device of the present invention is thin and consumes less electric power, reduction in thickness and power consumption of the display device is possible.

Figure 8:
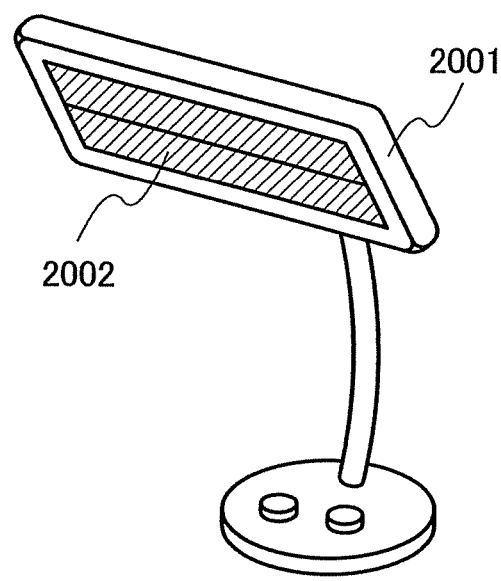
FIG. 8 shows an illumination device according to the present invention.

FIG. 8 illustrates an example in which the light emitting device of the present invention is used as a desk lamp, which is an illumination device. The desk lamp illustrated in FIG. 8 includes a housing 2001 and a light source 2002. The light emitting device of the present invention is used as the light source 2002. Since the light emitting device of the present invention has a long lifetime, the desk lamp can also have a long lifetime.

Figure 9:
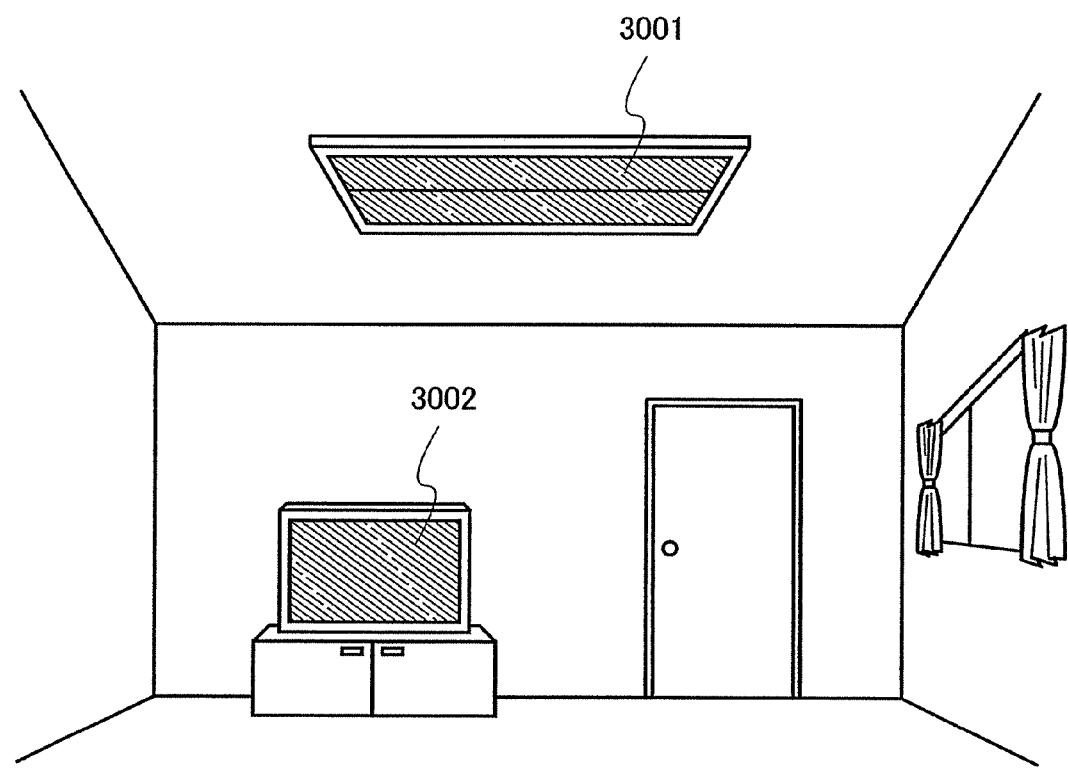
FIG. 9 shows an illumination device according to the present invention.

FIG. 9 illustrates an example of using the light emitting device of the present invention as an interior illumination device 3001. Since the light emitting device of the present invention can be enlarged, the light emitting device can be used as a large-area illumination device. Moreover, since the light emitting device of the present invention has a long lifetime, the illumination device can also have a long lifetime. Thus, a television device 3002 of the present invention as shown in FIG. 6A can be installed in the room where the light emitting device of the present invention is used as the interior illumination device 3001, so that pubic broadcasting and movies can be watched. In such a case, since both of the television device and the illumination device have long lifetimes, frequency of replacement of the illumination device and the television device can be reduced, and environmental load can be reduced.

EXAMPLE 1

Figure 11:
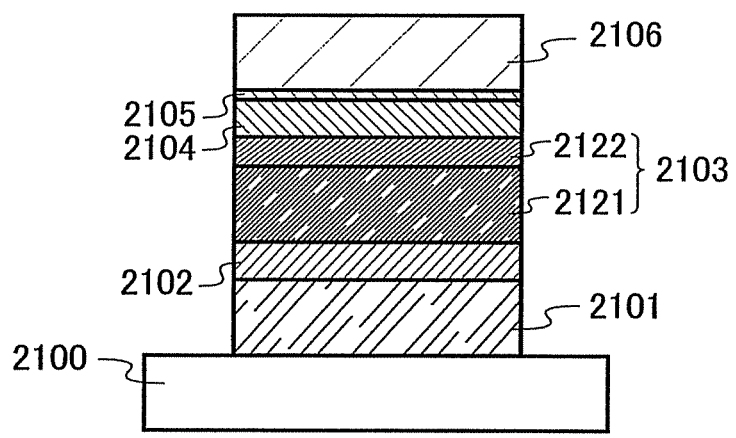
FIG. 11 shows a light emitting element of Example 1.

Example 1 will specifically describe a light emitting element of the present invention with reference to FIG. 11. Structural formulas of organic compounds used in this example are shown below. Note that a structural formula of a high molecular compound is omitted.

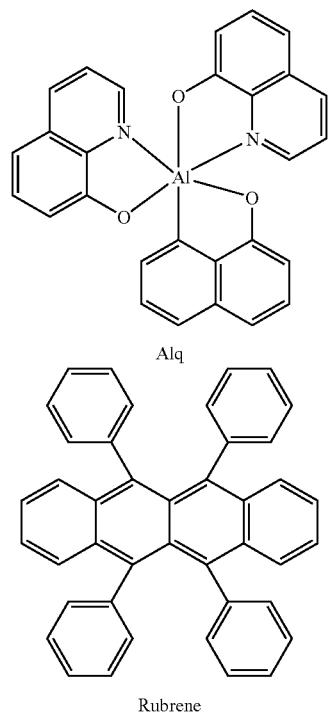

Alq

Rubrene

-continued

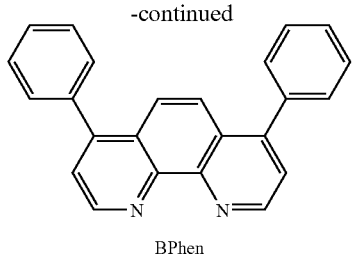

BPhen (Light Emitting Element 1)

First, a film of indium oxide-tin oxide containing silicon oxide was formed over a glass substrate 2100 by a sputtering method to form a first electrode 2101. The thickness of the first electrode 2101 was 110 nm and the electrode area was 2 mm×2 mm.

Then, a hole injecting layer 2102 was formed over the first electrode 2101. A poly (3,4-ethylenedioxythiophene)/poly (styrenesulfonate) (PEDOT/PSS) aqueous solution (catalog No.: BAYTRON P AI4083 LVW 142, Bayer Corporation) and 2-methoxyethanol were mixed at a ratio of 3:2 (=PEDOT/PSS:2-methoxyethanol), and stirred evenly, so that a solution A was prepared. First, a mixed solution of water and 2-methoxyethanol (3:2=water:2-methoxyethanol) was dropped over the first electrode 2101 and applied by a spin coating method. The rotation condition was as follows: rotation was conducted at 300 rpm (3 seconds), and then at 2000 rpm (20 seconds). Then, the solution A was dropped and rotation was conducted at 300 rpm (3 seconds), then at 2000 rpm (60 seconds), and further at 3000 rpm (10 seconds). By applying the mixed solution of water and 2-methoxyethanol before application of the solution A, uneven application of the solution A is suppressed and uniformity of a PEDOT/PSS layer can be improved. Thereafter, drying by heating under reduced pressure was performed for 1 hour in a vacuum oven where the temperature was set at 110° C.

Next, a light emitting layer 2103 was formed over the hole injecting layer 2102. First, a layer containing Super Yellow and rubrene was formed as a first light emitting layer 2121. 0.1 g of Super Yellow (Catalog No.: PDY132, Merck Ltd.) and 0.0022 g of rubrene were added into 10 mL of degassed toluene so that the solution includes Super Yellow and rubrene at a weight ratio of 1:0.02 (=Super Yellow:rubrene). Note that the preparation of the solution was performed under an environment where the $O_2$ concentration and the $H_2O$ concentration are low. This solution was dropped and applied by a spin coating method. The rotation condition was as follows: rotation was conducted at 300 rpm (3 seconds), then at 1000 rpm (60 seconds), and further at 2500 rpm (10 seconds). Thereafter, drying at normal pressure was performed at 80° C. in a nitrogen atmosphere for 10 minutes, and then drying by heating under reduced pressure was performed in a vacuum oven for 20 minutes. The thickness of the first light emitting layer 2121 obtained was 80 nm.

Further, a second light emitting layer 2122 was formed over the first light emitting layer 2121 by a vacuum evaporation method using resistance heating. The substrate was fixed to a substrate holder provided in a vacuum evaporation apparatus so that a surface on which the first light emitting layer 2121 was formed faces downward. The pressure was reduced to approximately $10^{-4}$ Pa, and co-evaporation of tris(8-quinolinolato)aluminum (abbr.: Alq) and rubrene was performed on the first light emitting layer 2121 to form the second light emitting layer 2122. The thickness of the second light emitting layer 2122 was made to be 10 nm, and the weight ratio of Alq and rubrene was made to be 1:0.005 (=Alq:rubrene). Note that a co-evaporation method is an evaporation method in which evaporation is performed from a plurality of evaporation sources at the same time in one treatment chamber.

Thereafter, a film of bathophenanthroline (abbr.: BPhen) was formed over the light emitting layer 2103 to have a thickness of 20 nm by an evaporation method using resistance heating, thereby forming an electron transporting layer 2104.

Then, a film of lithium fluoride (LiF) was formed over the electron transporting layer 2104 to have a thickness of 1 nm by an evaporation method using resistance heating, thereby forming an electron injecting layer 2105.

Last, a film of aluminum was formed to have a thickness of 200 nm by an evaporation method using resistance heating, thereby forming a second electrode 2106. Thus, the light emitting element 1 was formed.

(Comparative Light Emitting Element 2)

Instead of forming the second light emitting layer 2122 in the light emitting element 1, a layer of Alq was formed with a thickness of 10 nm, and a comparative light emitting element 2 was formed. Other layers were formed similar to the light emitting element 1.

(Comparative Light Emitting Element 3)

A comparative light emitting element 3, which was an element having a structure where the second light emitting layer 2122 and the electron transporting layer 2104 in the light emitting element 1 were not provided, was formed. That is, a layer of LiF that was an electron injecting layer was formed over a layer containing Super Yellow and rubrene. Other layers were formed similar to the light emitting element 1.

The light emitting element 1, the comparative light emitting element 2, and the comparative light emitting element 3 obtained in the above-described manner were put in a glove box containing a nitrogen atmosphere and sealing treatment was conducted so that the light emitting elements are not exposed to air. Then, operation characteristics of these light emitting elements were measured. The measurement was conducted at room temperature (atmosphere kept at 25° C.).

Figure 12:
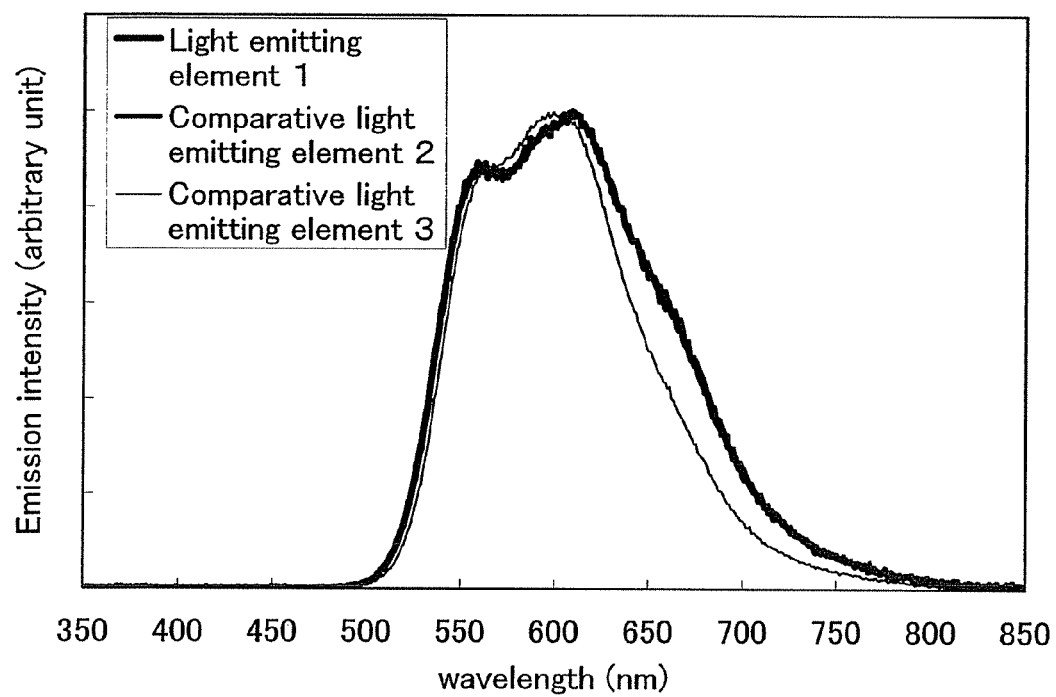
FIG. 12 shows light emission spectra of light emitting elements formed in Example 1.

Light emission spectra of the light emitting element 1, the comparative light emitting element 2, and the comparative light emitting element 3 are shown in FIG. 12. The light emission spectra shown in FIG. 12 were obtained when a current of 1 mA flowed through each of the light emitting elements. As is understood from FIG. 12, each of the light emitting element 1, the comparative light emitting element 2, and the comparative light emitting element 3 exhibits light emission from rubrene.

Figure 13:
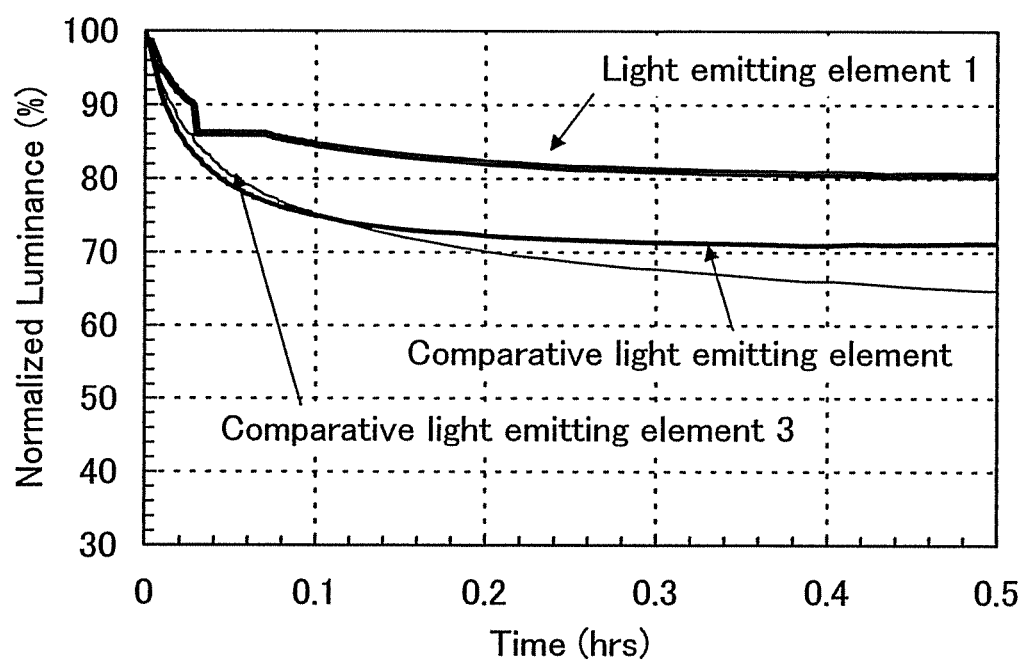
FIG. 13 shows time dependence of normalized luminance of the light emitting elements formed in Example 1.

FIG. 13 shows results of a continuous lighting test in which the light emitting element 1, the comparative light emitting element 2, and the comparative light emitting element 3 were continuously lit by constant current driving with the initial luminance set at 1000 cd/m². In FIG. 13, the vertical axis indicates the normalized luminance when 1000 cd/m² is assumed as 100%.

FIG. 13 shows the test results for 0.5 hours from the start of testing. From FIG. 13, it is found that initial deterioration of the light emitting element 1 is suppressed considerably compared to those of the comparative light emitting element 2 and the comparative light emitting element 3. Furthermore, the luminance of the light emitting element 1 after 50 hours from the start of testing keeps 73% of the initial luminance, whereas that of the comparative light emitting element 2 decreases to 70% of the initial luminance and that of the comparative light emitting element 3 decreases to 43% of the initial luminance.

Therefore, by applying the present invention, a light emitting element with a long lifetime can be obtained. In particular, it was found that by applying the present invention, initial deterioration can be suppressed considerably.

This application is based on Japanese Patent Application serial No. 2006-327666 filed in Japan Patent Office on Dec. 4, 2006, the entire contents of which are hereby incorporated by reference.

What is claimed is:

1. A light emitting device comprising:
an anode;
a light emitting layer over the anode, the light emitting layer comprising:
a first layer; and
a second layer over the first layer; and
a cathode over the second layer,
wherein the first layer includes a first organic compound and a polymer having a hole transporting property,
wherein the second layer includes a second organic compound and an organic compound having an electron transporting property,
wherein the first organic compound and the second organic compound are the same as each other and are selected from 4-(9H-carbazol-9-yl)-4'-(10-phenyl-9-anthryl)triphenylamine,4,4'-(2-tert-butylanthracen-9,10-diyl)bis{N-[4-(9H-carbazol-9-yl)phenyl]-N-phenylaniline}, N,9-diphenyl-N-[4-(10-phenyl-9-anthryl)phenyl]-9H-carbazol-3-amine,N,N"-(2-tert-butylanthracene-9,10-diyldi-4,1-phenylene)bis[N,N',N'-triphenyl-1,4-phenylenediamine],N,N'-bis[4-(9H-carbazol-9-yl)phenyl]-N,N'-diphenylstilbene-4,4'-diamine, N-[4-(9H-carbazol-9-yl)phenyl]-N-phenylstilbene-4-amine, and N,N'-diphenyl-N,N'-bis(9-phenylcarbazol-3-yl)stilbene-4,4'-diamine.

2. A light emitting device according to claim 1 further comprising:
a hole transporting layer between the anode and the first layer and an electron-transporting layer between the cathode and the second layer.

3. A light emitting device according to claim 1, wherein the polymer is selected from poly(N-vinylcarbazole), poly(4-vinyltriphenylamine), poly[N-(4-{N'-[4-(4-diphenylamino)phenyl]phenyl-N'-phenylamino}phenyl)methacrylamide], and poly[N,N'-bis(4-butylphenyl)-N,N'-bis(phenyl)benzidine.

4. A light emitting device according to claim 1, wherein the organic compound having the electron transporting property is selected from 9-[4-(10-phenyl-9-anthryl)phenyl]-9H-carbazole,3,6-diphenyl-9-[4-(10-phenyl-9-anthryl)phenyl]-9H-carbazole,9,10-bis(3,5-diphenylphenyl)anthracene,9,10-di(2-naphthyl)anthracene,2-tert-butyl-9,10-di(2-naphthyl)anthracene,9,9'-bianthryl,9,9'-(stilben-3,3'-diyl)diphenanthrene,9,9'-(stilben-4,4'-diyl)diphenanthrene, and 3,3',3"-(benzene-1,3,5-triyl)tripyrene.

5. A light emitting device according to claim 1 further comprising:
a controller for controlling light emission of the light emitting device.

6. A light emitting device according to claim 1, wherein the light emitting device is a display portion.

7. A light emitting device comprising:
an anode;
a light emitting layer over the anode, the light emitting layer comprising:
a first layer; and
a second layer over the first layer; and
a cathode over the second layer,
wherein the first layer includes a first organic compound and a polymer having a hole transporting property,
wherein a highest occupied molecular orbital level of the polymer is greater than or equal to −6.0 eV and less than or equal to −5.0 eV, and a lowest unoccupied molecular orbital level of the polymer is greater than or equal to −3.0 eV and less than or equal to −2.0 eV,
wherein the second layer includes a second organic compound and an organic compound having an electron transporting property,
wherein a highest occupied molecular orbital level of the organic compound having the electron transporting property is greater than or equal to −6.0 eV and less than or equal to −5.0 eV, and a lowest unoccupied molecular orbital level of the organic compound having the electron transporting property is greater than or equal to −3.0 eV and less than or equal to −2.0 eV,
wherein the first organic compound and the second organic compound are the same as each other and are selected from 4-(9H-carbazol-9-yl)-4'-(10-phenyl-9-anthryl)triphenylamine,4,4'(2-tert-butylanthracen-9,10-diyl)bis{N-[4-(9H-carbazol-9-yl)phenyl]-N-phenylaniline}, N,9-diphenyl-N-[4-(10-phenyl-9anthryl)phenyl]-9H-carbazol-3-amine,N,N"-(2-tert-butylanthracene-9,10-diyldi-4,1-phenylene)bis[N,N',N'-triphenyl-1,4-phenylenediamine],N,N'-bis[4-(9H-carbazol-9-yl)phenyl]-N,N'-diphenylstilbene-4,4'-diamine,N-[4-(9H-carbazol-9-yl)phenyl]-N-phenylstilbene-4-amine, and N,N'-diphenyl-N,N'-bis(9-phenylcarbazol-3-yl)stilbene-4,4'-diamine.

8. A light emitting device according to claim 7 further comprising:
a hole transporting layer between the anode and the first layer and an electron-transporting layer between the cathode and the second layer.

9. A light emitting device according to claim 7, wherein the polymer is selected from poly(N-vinylcarbazole), poly(4-vinyltriphenylamine), poly[N-(4-{N'-[4-(4-diphenylamino)phenyl]phenyl-N'-phenylamino}phenyl)methacrylamide], and poly[N,N'-bis(4-butylphenyl)-N,N'-bis(phenyl)benzidine.

10. A light emitting device according to claim 7, wherein the organic compound having the electron transporting property included in the second layer is selected from 9-[4-(10-phenyl-9-anthryl)phenyl]-9H-carbazole,3,6-diphenyl-9-[4-(10-phenyl-9-anthryl)phenyl]-9H-carbazole,9,10-bis(3,5-diphenylphenyl)anthracene,9,10-di(2-naphthyl)anthracene, 2-tert-butyl-9,10-di(2-naphthyl)anthracene,9,9'-bianthryl,9,9'-(stilben-3,3'-diyl)diphenanthrene,9,9'-(stilben-4,4'-diyl)diphenanthrene, and 3,3',3"-(benzene-1,3,5-triyl)tripyrene.

11. A light emitting device according to claim 7 further comprising:
a controller for controlling light emission of the light emitting device.

12. A light emitting device according to claim 7, wherein the light emitting device is a display portion.

13. A light emitting device comprising:
an anode;
a light emitting layer over the anode, the light emitting layer comprising:
a first layer ; and
a second layer over the first layer; and
a cathode over the second layer,
wherein the first layer includes a first organic compound and a polymer having a hole transporting property, wherein the second layer includes a second organic compound and an organic compound having an electron transporting property, wherein a difference between a highest occupied molecular orbital level of the polymer and a highest occupied molecular orbital level of the organic compound having the electron transporting property is 0.3 eV or less, wherein a difference between a lowest unoccupied molecular orbital level of the polymer and a lowest unoccupied molecular orbital level of the organic compound having the electron transporting property is 0.3 eV or less, wherein the first organic compound and the second organic compound are the same as each other and are selected from 4-(9H-carbazol-9-yl)-4'-(10-phenyl-9-anthryl)triphenylamine,4,4'-(2-tert-butylanthracen-9,10-diyl)bis{N[4-(9H-carbazol-9-yl)phenyl]-N-phenylaniline}, N,9-diphenyl-N-[4-(10-phenyl-9-anthryl)phenyl]-9H-carbazol-3-amine,N,N"-(2-tert-butylanthracene-9,10-diyldi-4,1-phenylene)bis[N,N',N'-triphenyl-1,4-pylenediamine],N,N'-bis[4-(9H-carbazol-9-yl)phenyl]-N,N'-diphenyltilbene-4,4'-diamine,N-[4-(9H-carbazol-9-yl)phenyl]-N-phenylstilbene-4-amine, and N,N'-diphenyl-N,N'-bis(9-phenylcarbazol-3-yl)stilbene-4,4'-diamine.

14. A light emitting device according to claim 13 further comprising:
a hole transporting layer between the anode and the first layer and an electron-transporting layer between the cathode and the second layer.

15. A fight emitting device according to claim 13, wherein the polymer is selected from poly(N-vinylcarbazole), poly(vinyltriphenylamine), poly[N-(4-{N'-[4-(4-diphenylamino)phenyl]phenyl-N'-phenylamino}phenyl)methacrylamide], and poly[N,N'-bis(4-butylphenyl)-N,N'-bis(phenyl)benzidine.

16. A light emitting device according to claim 13, wherein the organic compound having the electron transporting property included in the second layer is selected from 9-[4-(10-phenyl-9-anthryl)phenyl]-9H-carbazole,3,6-diphenyl-9-[4-(10-phenyl-9-anthryl)phenyl]-9H-carbazole,9,10-bis(3,5-diphenylphenyl)anthracene,9,10-di(2-naphthyl)anthracene, 2-tert-butyl-9,10-di(2-naphthyl)anthracene,9,9'-bianthryl,9,9'-(stilben-3,3'-diyl)diphenanthrene,9,9'-(stilben-4,4'-diyl)diphenanthrene, and 3,3',3"-(benzene-1,3,5-triyl)tripyrene.

17. A light emitting device according to claim 13 further comprising:
a controller for controlling light emission of the light emitting device.

18. A light emitting device according to claim 13, wherein the light emitting device is a display portion.

19. A light emitting device comprising:
an anode;
a first light emitting unit over the anode;
a charge generation layer over the first light emitting unit;
a second light emitting unit over the charge generation layer; and
a cathode over the second light emitting unit;

wherein each of the first light emitting unit and the second light emitting unit comprises:
a first layer including a first organic compound and a polymer having a hole transporting property; and
a second layer over and in contact with the first layer, the second layer including a second organic compound and an organic compound having an electron transporting property, wherein in each of the first and second light emitting units, the first layer is located between the anode and the second layer, wherein the first organic compound and the second organic compound are the same as each other and are selected from 4-(9H-carbazol-9-yl)-4'-(10-phenyl-9-anthryl)triphenylamine,4,4'-(2-tert-butylanthracen-9,10-diyl)bis{N-[4-(9H-carbazol-9-yl)phenyl]-N-phenylaniline}, N,9-diphenyl-N-[4-(10-phenyl-9-anthryl)phenyl]-9H-carbazol-3-amine,N,N"-(2-tert-butylanthracene-9,10-diyldi-4,1-phenylene)bis[N,N',N'-triphenyl-1,4-phenylenediamine],N,N'-bis[4-(9H-carbazol-9-yl)phenyl]-N,N'-diphenylstilbene-4,4'-diamine,N-[4-(9H-carbazol-9-yl)phenyl]-N-phenylstilbene-4-amine, and N,N'-diphenyl-N,N'-bis(9-phenylcarbazol-3-yl)stilbene-4,4'-diamine.

20. A light emitting device according to claim 19, wherein at least one of the first and second light emitting units further comprises a hole transporting layer between the anode and the first layer and an electron transporting layer between the cathode and the second layer.

21. A light emitting device according to claim 19, wherein the polymer is selected from poly(N-vinylcarbazole), poly(4-vinyltriphenylamine), poly[N-(4-{N'-[4-(4-diphenylamino)phenyl]phenyl-N'-phenylamino}phenyl)methacrylamide], and poly[N,N'-bis(4-butylphenyl)-N,N'-bis(phenyl)benzidine.

22. A light emitting device according to claim 19, wherein the organic compound having the electron transporting property included in the second layer is selected from 9-[4-(10-phenyl-9-anthryl)phenyl]-9H-carbazole,3,6-diphenyl-9-[4-(10-phenyl-9-anthryl)phenyl]-9H-carbazole,9,10-bis(3,5-diphenylphenyl)anthracene,9,10-di(2-naphthyl)anthracene, 2-tert-butyl-9,10-di(2-naphthyl)anthracene,9,9'-bianthryl,9, 9'-(stilben-3,3'-diyl)diphenanthrene,9,9'-(stilben-4,4'-diyl)diphenanthrene, and 3,3',3"-(benzene-1,3,5-triyl)tripyrene.

23. A light emitting device according to claim 19, wherein the charge generation layer includes a composite material of an organic compound and a metal oxide.

24. A light emitting device according to claim 19 further comprising:
a controller for controlling light emission of the light emitting device.

25. A light emitting device according to claim 19, wherein the light emitting device is a display portion.

* * * * *